US006229376B1

(12) United States Patent
Geysen

(10) Patent No.: US 6,229,376 B1
(45) Date of Patent: May 8, 2001

(54) ELECTRONIC ARRAY AND METHODS

(76) Inventor: Hendrik Mario Geysen, 671 Brookview Dr., Chapel Hill, NC (US) 27514

( * ) Notice: Subject to any disclaimer, the term of this patent is extended or adjusted under 35 U.S.C. 154(b) by 0 days.

(21) Appl. No.: 09/478,651

(22) Filed: Jan. 6, 2000

Related U.S. Application Data

(60) Provisional application No. 60/114,858, filed on Jan. 6, 1999.

(51) Int. Cl.[7] .......... H03K 17/62

(52) U.S. Cl. .......... 327/403; 327/355; 327/538

(58) Field of Search .......... 327/355, 357, 327/358, 359, 360, 403, 404, 405, 538, 543

(56) References Cited

U.S. PATENT DOCUMENTS

| | | | |
|---|---|---|---|
| 4,317,082 | 2/1982 | Gross | 330/288 |
| 5,097,141 * | 3/1992 | Leivian et al. | 307/201 |
| 5,914,868 * | 6/1999 | Han et al. | 363/60 |
| 6,141,676 * | 10/2000 | Ramirez-Angulo et al. | 708/804 |

FOREIGN PATENT DOCUMENTS

0373471 A1 6/1990 (EP) .

OTHER PUBLICATIONS

S.W. Kuffler & J.G. Nicholls, *From Neuron To Brain A Cellular Approach to the Function of the Nervous System*, 1976, pp. 9–29.

B. Hille, *Ionic Channels of Excitable Membranes*, 1984, pp. 101 & 105.

C. Mead, *Analog VLSI and Neural Systems.*

L. Weinberg, *Network Analysis and Synthesis*, McGraw–Hill, ISBN 0–88275–321–5 (1975) [Copy ordered—will follow in the near future].

*Analogue IC design: The Current–Mode Approach*, Edited by C. Ioumazou, F.J. Lidgey & D.G. Haigh, ISBN 0 86341 297 1.

* cited by examiner

*Primary Examiner*—Jeffrey Zweizig

(74) *Attorney, Agent, or Firm*—Townsend and Townsend and Crew LLP

(57) ABSTRACT

An electronic network comprises a plurality of nodes that each comprise a current input and a current output, and at least one transistor arranged as a first current mirror and a second current mirror. The first and the second current mirrors are complementary to each other such that an output of the first current mirror is operably connected to an input of the second current mirror. Resistive connections connect the nodes such that the output of one or more of the nodes is resistively connected to the input of one or more of the nodes.

22 Claims, 30 Drawing Sheets

$$I_{IN\,1} = \frac{R_1}{R_1+R_2+R_3} I_{IN}$$

$$I_{IN\,2} = \frac{R_2}{R_1+R_2+R_3} I_{IN}$$

$$I_{IN\,3} = \frac{R_3}{R_1+R_2+R_3} I_{IN}$$

ELECTRONIC ARRAY AND METHODS

CROSS-REFERENCES TO RELATED APPLICATIONS

This application claims the benefit of U.S. Provisional Patent Application Ser. No. 60/114,858, filed Janu. 6, 1999, the complete disclosure of which is herein incorporated by reference.

BACKGROUND OF THE INVENTION

Computer technology is a large part of almost every aspect of modern living. Computers range from fast and large super computers used to tackle very complex calculations, such as those associated with weather prediction, molecular dynamics and fluid flow problems, to single chip units that may be found in many everyday appliances such as washing machines, VCR's and cars. A common feature of nearly all modern-day computers is that they use a binary system for both the instruction codes and the representation of the data on which the instructions operate. A further feature of modern digital computers is that, for any process, an explicit set of instructions is assembled to completely describe how data is to be manipulated from the time it is retrieved or accessed until a result is to be either used or stored in an appropriate location or device. For some processes, such as the storing and retrieving of large volumes of data, either as text (ASCII format) or as values (Binary format), digital computers are eminently suitable. However, there also exist many tasks for which the digital architecture is far from ideal, such as the modeling of complex interactions best described by differential equations. Real world processes involve macroscopic properties that are analog in that they can have any value within a continuous range (excluded are the special conditions under which quantitation of properties can be demonstrated). Therefore these analog values need to be converted into a digital format before they can be used in any computation.

More importantly, digital computers operate in a completely different way from the nervous system or brains of even the most simple of organisms. A great deal of literature has been written about, and research carried out on, the distinction between the modern digital and neural processing of information, with the further realization that the latter is intimately linked with an ability to learn about the external world. Today an increasing amount of effort is expended towards gaining an understanding of the neural process with the aim of creating a machine to combine the ability to learn by experience with its computational and interpretive ability.

Soon after the revolution in transistor electronics, machines were built that were able to accept analog voltage values representative of real world parameters and process these according to predetermined arrangement of summing, integrating and differentiating units. The output of these analog computers were also voltages, again representative of the resulting computation. Their single biggest drawback was that the circuit had to be reconfigured each time a change in the actual computation was necessitated. Even so, nearly all transducers measuring real world properties in use today are associated with some fixed analog signal processing capability, both linear and non-linear in terms of the transformations applied.

SUMMARY OF THE INVENTION

The invention provides various electronic circuits or devices where at least two current mirrors are coupled together in a complementary manner. With such a configuration, an output current of the combined current mirrors is related to an input current, and in the case where a PNP current mirror follows a NPN current mirror the output current is at a higher (in absolute value) potential difference. In one aspect, a controlling current may be input to the first current mirror and one or more other inputs to the first current mirror and/or one or more outputs of the second current mirror may be mirrored by the controlling current. In another aspect, the complementary current mirrors of the invention may be arranged as a system of nodes that are resistively connected to form a network which is able to process various types of current signals. A single or multiple inputs and a single or multiple outputs may be utilized with each mode. Further, signals may be transmitted between the nodes in a feedback and/or a feed forward manner.

Hence, the network nodes of the invention comprise a circuit configuration that has a current input associated with the summing junction of a current mirror, components that copy this input current to optionally provide for both positive feedback and positive feedforward. Additionally, a network node has a current output derived from a current mirror of opposite polarity to the mirror at the current input and components that copy this input current to optionally provide for both negative feedback and negative feedforward. An important property of this form of node is that its input can be directly connected to one or more outputs from other nodes that comprise a network without regard to the resistance of that connection. It is also possible to connect the input to the feedback or feedforward (positive or negative) of any other node without regard to the resistance of that connection. Network nodes can differ for each other in the type of signal the produce at the output, with the stipulation that the signal is a current. Signals may be of the analogue type whereby the information is encoded in the magnitude of the current. Another type of node may process the signal in the form of current packets, the magnitude of which may be set by an external trip voltage. In these types of nodes the information is encoded in terms of the frequency of the current packets. Network nodes are not limited to be either of the forgoing, but could easily be a combination of the two forms or of other signal forms. Another property of network nodes is that nodes of different type can be directly connected again without regard to the resistance of that connection.

The invention may also employ input nodes and output nodes to facilitate coupling of the network to external components or systems. For example, an input node may comprise a circuit configuration that accepts an input related to some real-world property or parameter value and outputs a current from a current mirror so as to allow direct connection to the input or inputs of one or more network nodes without regard to the resistance of that connection.

An output node may comprise a circuit configuration that accepts a current at the summing junction of a current mirror so as to allow direct connection to the output or outputs of one or more network nodes without regard to the resistance of that connection. This current is then translated into a form as to be useful in the interpretation of the whole network transformation of all the network inputs, and could take the form of a current, a voltage, a simple binary output, a digital output with more resolution than provided by a simple digital output, or the like.

As previously mentioned, the network nodes are resistively connected. This may be accomplished, for example, by using a resistive matrix or network. Resistive networks can be constructed from discrete resistors, from a resistive medium, such as, for example, polysilicon, cadmium sulfide, or the like, or a combination of discrete resistors and a resistive medium. Further, when using discrete resistors many arrangements are possible and are known to those skilled in the art. Resistive network are described generally in C. Mead, "Analog VLSI and Neural Systems" (especially Appendix C), and in Louis Weinberg, "Network Analysis and Synthesis", McGraw-Hill, ISBN 0-88275-321-5 (1975), the complete disclosures of which are herein incorporated by reference.

In one particular embodiment, the invention provides a hardware arrangement of semiconductor devices or semiconductor junctions utilizing the principles of current mirroring. These devices or circuit configurations (nodes) may be assembled into an array to effect the functions of an analog computer. Arrays of nodes may be assembled to operate in a fixed mode to carry out functions closely approximating neural network transformations. Arrays of nodes may also be configured such that the transfer function of the network is programmable, i.e. the manner in which the current signals are transferred through the network is programmable. Another configuration of an array of nodes allows the transfer function to be dynamically altered, either by a separate controller or by the output of the array itself. Further, the transfer function may be controlled by both a separate program sequencer in conjunction with the output of the array itself.

In all the foregoing modes of operation, the information flow within the array may be encoded in a direct analog format, e.g., the value of an electrical current. Information flow within the array of nodes may also be encoded in the form of a pulse train where the frequency of the pulses is related to a parameter value, or information may be processed as a combination of the two aforementioned modes.

The simplicity of the node configuration allows for a high density of nodes to be integrated into a network by utilizing current standards for integrated circuit fabrication techniques. In this way, complex networks may readily be constructed.

The analog processing arrays of the invention, either alone or in conjunction with digital microprocessors, overcome computational limitations associated with present generation computers due to their lack of speed. The analog processing arrays of the invention may also find use for tasks to which modem digital computers are unsuited. A further promising area for the analog processing arrays of the invention is in field of artificial intelligence. More specifically, the processing arrays of the invention may be configured to "learn" their optimum configurations (or transfer functions) from a training set of data or over a course of time during which they are exposed to inputs. In this way, the arrays are permitted to optimally reconfigure themselves for the tasks at hand.

DESCRIPTION OF THE SPECIFIC EMBODIMENTS

Figures 1A, 1B, 1C, 1D:
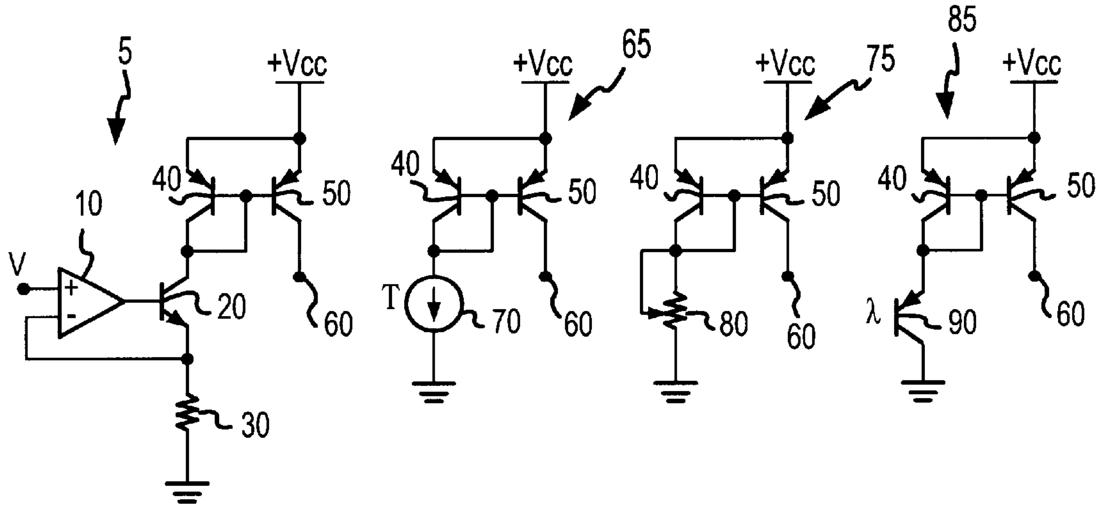
FIGS. 1_a,_ 1_b,_ 1_c_ & 1_d_ schematically illustrates four examples of analog input nodes according to the invention.

The invention provides various arrangements of current mirrors that are complementary to each other to perform a wide variety of operations. As used herein, a current mirror is defined as an electronic device or arrangement of electronic components such that an output current is related to an input current. In some cases, an output current is equal to, or mirrored by, an input current. In other cases, an output current may be related in other ways, e.g., a multiple, a fraction, and the like. Further, current mirrors may be configured to have multiple inputs and/or outputs. A general discussion of current mirrors is found in *Analogue IC design: The Current-Mode Approach,* Edited by C. Ioumazou, F. J. Lidgey & D. G. Haigh, ISBN 0 86341 297 1 (see especially chapters 6, 7 and 14), the complete disclosure of which is herein incorporated by reference.

Current mirrors that are complementary to each other are defined as at least two current mirrors that are coupled together such that an output current of the combined current mirrors is related to an input current, and such an output current is sourced from a potential one $V_{BE}$ below the positive voltage rail for the case where a NPN bipolar or N channel MOS current mirror is followed by a PNP bipolar or P channel MOS current mirror. Alternatively, the output current is a sink at one $V_{BE}$ above ground potential for the case where a PNP bipolar or P channel MOS current mirror is followed by a NPN bipolar or N channel MOS current mirror. In one aspect, the complementary current mirrors form a node. A controlling current may be input to the node, and one or more inputs to the node and/or one or more outputs from the node may be related to the controlling current. In one aspect, inputs and/or outputs are mirrored by the controlling current. Conveniently, a controlling current may be obtained from one or more analog signals. Such analog signals may be obtained, for example, from one or more sensors.

Some examples of controlling currents are those where a sensor is directly coupled to a current mirror and regulate the mirror controlling current, those where two or more sensors are coupled to a current mirror to regulate the mirror controlling current as the sum of the input to the sensors, those where two or more sensors are connected such that the controlling current is proportional to the smaller sensor signal or the larger sensor signal, or the larger minus the smaller sensor signal.

The current mirrors of the invention that are complementary to each other utilize a driving current to permit the output current to be sourced from a potential one $V_{BE}$ below the positive rail voltage for the case where a NPN bipolar or N channel MOS current mirror is followed by a PNP bipolar or P channel MOS current mirror. Alternatively, the driving current may permit the output current to be a sink at one $V_{BE}$ above ground potential for the case where a PNP bipolar or P channel MOS current mirror is followed by a NPN bipolar N channel MOS current mirror. A voltage supply is employed to produce the driving current. For every coulomb of charge transferred through a complementary current mirror pair, two coulombs of charge are utilized from the voltage supply. In the absence of any charge transfer through complementary current mirror node, essentially zero (or negligible) current is drawn from the power supply to the node.

In one aspect, an array of current mirrors that are complementary to each other may be connected together as nodes within a network, where one or more outputs of one or more nodes provide one or more inputs for one or more nodes within the network. In this way, information may be transmitted in a feedforward or a feedback manner through the network. By using a driving current for each node, information is able to flow through the nodes of the network, with the driving current being double to a current flowing between complementary current mirrors. For a given node within a network, a driving current may be supplied simply by placing the node at an appropriate potential difference. Advantageously, a network of current mirrors draws current from a power supply proportional to the sum of all the currents transferred through the network from inputs to outputs. Because the complementary current mirrors of the invention are current controlling devices, they may be interconnected directly without using resistors to limit currents to a safe level.

A network of complementary current mirror nodes may be configured to perform the functions of essentially any type of neural network function. Merely by way of example, the networks of the invention may be employed in the following neural network applications: optical character recognition, speech recognition, handwriting recognition, traffic monitoring, virus detection, financial analysis, and the like In one particular arrangement, complementary current mirrors are coupled together to form a four terminal semiconductor device which has the ability to output a current in a direct relationship to the input current of the device. In the simplest case, the relationship of inputs to outputs is 1:1. Such a device may be constructed from two similar NPN transistors and two similar PNP transistors. Such a construction is possible because the physical dimensions and doping levels of the semiconductor regions that form each pair of like transistors are equal or similar. Other relationships between the input current and the mirrored current are possible by changing the relationship between the physical dimensions within each pair of devices that form a single current mirror. For example, for a current mirror in which the controlling transistor has one half the base emitter area of the slave transistor the output current from the current mirror will be twice the input current. Other ratios of the areas of the base emitter junction will give corresponding ratios between the controlling current and the mirrored current. Alternatively, the use of more than two similar transistors may be arranged to give ratios of input to output current which are different from 1:1. In such a case, the ratio is determined by the ratio of the number of transistors connected to accept the input current and the number of transistors that mirror this input current to generate the output current.

A variety of useful properties result from various arrangements of two or more complementary current mirrors. In one aspect, the input current mirror may act as a summing junction for currents from any number of different sources, and then via the complementary current mirror, pass the aggregate sum of all the input currents out as a current source. In another aspect, no other passive or active electronic circuit elements are required to achieve the above outcome.

In one particular embodiment, a NPN current mirror is followed by a PNP current mirror, and the aggregate arrangement equates to a device in which a current sink is mirrored as a current source. In another embodiment, a PNP current mirror is followed by a NPN current mirror, and the aggregate arrangement equates to a device in which a current source is mirrored as a current sink.

In still another embodiment, a NPN current mirror is followed by a PNP current mirror, followed by a NPN current mirror, and the arrangement equates to a device in which a current sink is mirrored as a current sink. In yet another embodiment, a PNP current mirror is followed by a NPN current mirror, followed by a PNP current mirror, and the arrangement equates to a device in which a current source is mirrored as a current source. In some cases, many alternating current mirrors may be cascaded to faithfully mirror the input current at the output of the arrangement.

The simplicity of the combination of simple junctions of complementary semiconductor materials lends itself to circuit integration with high numerical densities. For example, arrays of interconnected current mirrors may be produced which exceed $10^6$ mirrors per device based on current fabrication technology.

The complementary current mirrors of the invention may utilize a variety of electrical components or building blocks to provide a wide variety of node configurations. For example, various electrical components may be constructed that allow the nodes to duplicate currents, add currents, subtract currents, multiply currents, divide or proportion currents, and the like. As described above, if any of these outputs are to be used within the network, the complementary current mirrors are configured to permit the output currents to move through the network. In this manner, vastly complex networks may be constructed.

A wide variety of current signals may be used within the networks of the invention. For example, current signals such as flat signals, pulse signals, spiked signals, and the like may be employed. In this way, various real life signals may be mimicked. For example, signals that mimic biological signals, such a brain signals, may be used within the networks of the invention. Because the networks of the invention rely on the use of current signals, real life analog inputs that are measured with sensors may be directly input. For example, signals such as sound signals, light signals, and the like may be converted to electrical analog signals and directly input into the network.

In one embodiment, the complementary current mirrors of the invention are directly coupled together. In other embodiments, such as when utilizing pulse circuits, an electronic element may be placed between the two mirrors. As one example, two complementary current mirrors are connected via a storage element, such as a capacitor, either as an added component or as the parasitic capacitance associated with transistor junctions themselves. In addition to this charge storage element, a threshold device or circuit may be configured such that once a given amount of charge accumulates on the storage element, an event is triggered which transfers this charge to the other current mirror of the pair. The purpose of this second current mirror is to allow some form of onward distribution of this current through the array as dictated by the array configuration.

While generally accepted electronic circuit books such as *Analogue IC design: The Current-Mode Approach,* Edited by C. Ioumazou, F. J. Lidgey & D. G. Haigh, ISBN 0 86341 297 1 (see especially chapters 6, 7 and 14), previously incorporated herein by reference, describe several ways to construct a current mirror, one convenient arrangement is to couple two transistors with common bases and emitters. For convenience of discussion, such current mirrors will be employed to describe certain embodiments of the invention. However, it will be appreciated that other ways may be employed to construct current mirrors. In one embodiment of the invention, a PNP bipolar or p-type MOS transistor, second current mirror follows a NPN bipolar or n-type MOS transistor, first current mirror, both operating from a unipolar positive voltage supply. This combined circuit element has the property of faithfully reproducing a current input to the first current mirror at an output of the second current mirror. Additionally, the input current enters the device at a summing junction near to ground potential, and the output is sourced from the device near to a positive rail potential. For every coulomb of charge transferred through such a complementary current mirror pair, two coulombs of charge are utilized from a voltage supply. In the absence of any charge transfer through the combined current element, essentially zero (or at worst a negligible current) is drawn from the power supply to the combined circuit.

While examples are shown herein with the input at either PNP bipolar or at P type MOS transistors, and the output coming from NPN or N type MOS transistors, it will be appreciated that this arrangement may be reversed. Alternatively, the input and output may both be at the same type of transistor by insertion of the appropriate additional current mirror. Further, equivalent circuits may be constructed using mixed type (bipolar or MOS) transistors.

In one aspect, multiple pairs of complementary current mirrors may be arranged in an array. Such an array of interconnected complementary current mirrors draws a current from the power supply proportional to the sum of all the currents transferred through the array from inputs to outputs. Interconnected arrays of current mirrors in this configuration may operate in an analogue mode where the information content at any point in the array is proportional to the magnitude of the current at that point. Further, since a complementary current mirror pair is a current controlling device it may be interconnected directly without using resistors to limit currents to a safe level. In another aspect, outputs from any number of current sources may be directly connected to the input of the PNP bipolar or n-type MOS transistor current mirror, which acts as a current summing junction and passes the aggregate to its complementary current mirror where the summed current is now sourced. In yet another aspect, bipolar current mirrors of the invention may use currents in the $\mu$A to mA range, and MOS transistors may use current in the pA to nA range. However, other current levels may be used for other types of devices.

As previously mentioned, the invention may utilize various arrangements of both input and output nodes. Such input and output nodes may be formed using a PNP bipolar transistor current mirror. However, it will be appreciated by those skilled in the art that equivalent input and output nodes may be constructed from NPN bipolar transistor current mirrors or from either N or P FET or MOS transistors.

One example of a complementary current mirror pair is where two current mirrors are linked where one comprises NPN transistors and the other comprises PNP transistors to form a pair of complementary current mirrors. Hence, $I_{out}$ may be held one $V_{BE}$ from the positive voltage $V^o$ and $I_{in,}$ the summary junction is maintained at one $V_{BE}$ above ground. It will be appreciated that one particularly preferable way to construct complementary current mirror pairs is to construct a single semiconductor device with multiple collectors. In such a case, the relationship between the input current and the output current may be controlled by the physical relationship of the appropriate semiconductor junctions.

As previously mentioned, various configurations of current mirrors may be employed as building blocks when forming a complementary current mirror circuit element. Different building blocks may be utilized depending on the desired function of the circuit element. For example, in one embodiment, a current mirror element of an array may be created by utilizing multiple transistors as discrete devices. Such an arrangement may give rise to current mirrors where several outputs are independently related to the input.

As one example, a PNP current mirror may be followed by a NPN current mirror. If instead of one transistor being connected to mirror the input current, n transistors are connected to have base and emitter junctions common, then a device is provided where a current source is mirrored to n current sinks which faithfully mirrors n outputs for a single input current. In similar fashion, the same is also true for the case where a NPN current mirror is followed by multiple PNP transistors, except that instead of mirroring the input as n current sinks, n current sources are provided. In another embodiment, multiple outputs may be a mirror of the input current. Further, the current outputs may be sourced from the positive rail voltage.

A complementary pair of current mirrors with multiple inputs and outputs may be constructed as one complex semiconductor device, as is common for complex arrangements of gates within logic circuits. With such an arrangement, current inputs and/or current outputs may be fed forward or backward to another pair of current mirrors within a network.

Inputs to current mirror arrays may be digital in nature where the input current reflects the binary nature of the input. For example, a digital "one" may be represented by some defined current level and a digital "zero" by the absence of any current, i.e. zero current. The inverse of the forgoing is also possible, as is the case where a digital "one" is represented by the absence of current and a digital "zero" by a defined current level. Another possibility is for a digital "one" to have one current value and a digital "zero" by another value.

Inputs to current mirror arrays may also be analog in nature. The current value transduced into the array may be related to the physical property being measured. This relationship may be linear or non-linear depending on the method of measurement and the circuit which provides the input current to the array.

One arrangement is where the input sensors and the first level of current mirrors are directly coupled at the time of manufacture of the complete integrated circuit. One application of such a technique is in the field of image analysis. For example, an array of light sensitive elements may be coupled to the input layer of an extensive current mirror array. Techniques for converting measured physical parameters into proportional currents are well known and any of these are suitable as inputs to the current mirror arrays of the invention.

Another input type that may be processed by current mirror arrays is that of pulse trains where either the amplitude of the pulse represents the input property or the frequency of the pulse train is used to encode the desired value. In some cases, it may be useful to directly convert the input current from one or more sensors into a pulse train in conjunction with the first level of the current mirror array. Such arrangements may allow the input nodes to be constructed at the time of production of the array itself.

Outputs from complementary current mirror arrays of the invention depend on the method chosen for processing the inputs to the array. Therefore, the outputs may be simple currents, amplitude encoded pulse trains, frequency encoded pulse trains, combinations of the foregoing, and the like. In general, some signal processing may be desirable in the context of analog computing before an output is produced. In some cases, processed encoded information in analog form may be converted into some form of binary representation, either a simple two level state where the output is above or below some threshold value, or to a more extensive binary representation of multiple values.

There are also instances, e.g., in process control, where the output from a complementary current mirror array is left in its analog form and directly input to the devices to be controlled. Standard techniques in electronics allow conversion of one form of output to another output type.

One form of complementary current mirror array is operated from a unipolar voltage source that supplies the driving current. However, it will be appreciated that bipolar voltage supplies may also be used to operate the arrays of the invention.

In some cases, two current mirror arrays may be configured to operate in parallel with interactions between the arrays. In such an arrangement, one array may be activated by one side of a bipolar voltage supply, and another array may be activated by the other half of the bipolar supply.

In one arrangement, complementary current mirrors may be employed to implement complex functions. It is known in the art that a semiconductor junction such as is present in a diode acts as a convenient summing junction for multiple currents. Connecting a transistor to such a junction in which the diode (or transistor in which collector and base are connected), is across the base and emitter terminals of a second transistor, a current sink or source is produced which operates proportional to the aggregate of the currents summed at the diode junction.

Current summing junctions may also be assembled from more than one current mirror; in particular, by incorporation of at least one complementary pair of current mirrors. In addition to arrangements having the ability to sum currents, multiple current mirrors may be connected to implement current subtraction, current multiplication, taking the ratio of a current, proportional ratio current distribution, proportional ratio current subtraction, or other more complex functions. Given that many non-linear processes may be described as the sum of infinite series, the basic building blocks of the invention, i.e., complementary current mirrors, may be assembled to implement very complex functions.

The complementary current mirror arrays of the invention may also be operated in a pulse frequency mode. This may be accomplished by directly coupling a circuit or sensor that has an output of pulse encoded information, or by using one of several possible methods to convert a voltage or current into a pulse train as previously described. Arrays of the invention utilizing the pulse frequency mode are somewhat analogous to the neural network model of the brain. One advantage of this mode of operation is that it takes advantage of the inherent capacitance associated with real semiconductor devices and the interconnections of any practical circuit. The maximum operational frequency of an array may be limited by the physical dimensions of the composite transistors as well as the choice of semiconductor material from which the transistors are made. In general, transistors are readily available that operate at frequencies exceeding 100 MHz. Therefore, in the pulse frequency mode, given the parallel nature of the processing of multiple inputs by current mirror arrays, high net processing throughputs are possible. Operation in a pulse frequency mode may in some cases necessitate extra signal processing at the outputs of the array, where the output is required to be analog or digital in nature.

Referring now to FIGS. 1*a*–1*d*, various types of input nodes will be described. FIG. 1*a* illustrates a voltage to current converter 5 formed from an operational amplifier 10, a transistor 20 and a resister 30 which causes a current proportional to voltage V to flow out of the current mirror formed by two transistors 40 and 50. This current is then mirrored as an equal current (within the constraints of the matching of transistors 40 and 50), and sourced as an output 60 from transistor 40.

FIG. 1*b* illustrates a voltage to current converter 65 that is similar to that in FIG. 1*a* (and will use the same reference numerals for identical elements) except that the voltage controlled current converter has been replaced by a temperature dependent current source 70. FIG. 1*c* illustrates another embodiment of a voltage to current converter 75 that is similar to that in FIG. 1*a* except that the voltage controlled current converter has been replaced by a positional dependent current source in the form of a variable resistance 80. FIG. 1*d* illustrates a voltage to current converter 85 that is similar to that in FIG. 1*a* except that the voltage controlled current converter has been replaced by a light dependent current source in the form of phototransistor 90.

Figure 2:
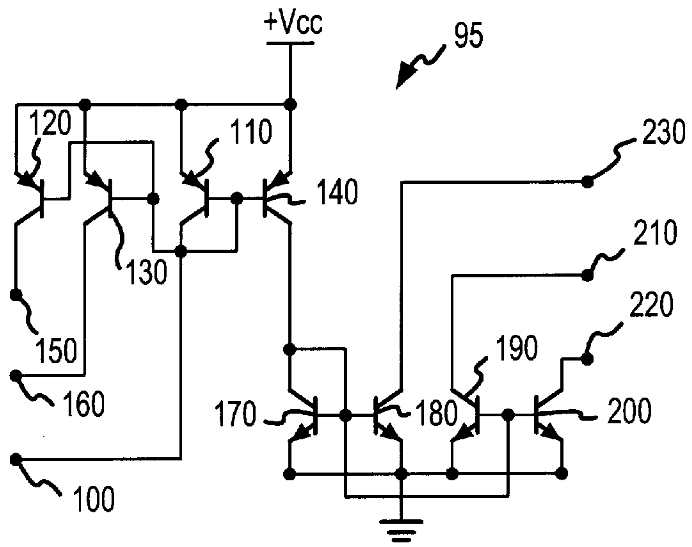
FIG. 2 is a schematic diagram of two complementary current mirrors according to the invention.

A wide variety of network nodes may be utilized to form a network. For example, FIG. 2 shows one implementation of an analog node 95 from which a computing network may be constructed. Node 95 comprises a current input 100 to a transistor 110 as a part of the current mirror formed by transistors 110, 120, 130 and 140, such that transistors 120, 130 and 140 mirror the current input 100 to source an equivalent current 150 for connection within a network as positive feedforward, and an equivalent current 160 for connection within a network as positive feedback. The additional mirrored equivalent current from transistor is inputted to transistor 170 as a part of the current mirror formed by transistors 170, 180, 190 and 200, such that transistors 180, 190 and 200 mirror the current input 100 to sink an equivalent current 210 for connection within a network as negative feedforward, and an equivalent current 220 for connection within a network as negative feedback. The additional mirrored equivalent current from transistor 200 is output 230 and used to provide input either to a node in a subsequent layer of nodes or to provide the input to an output node.

Figure 3:
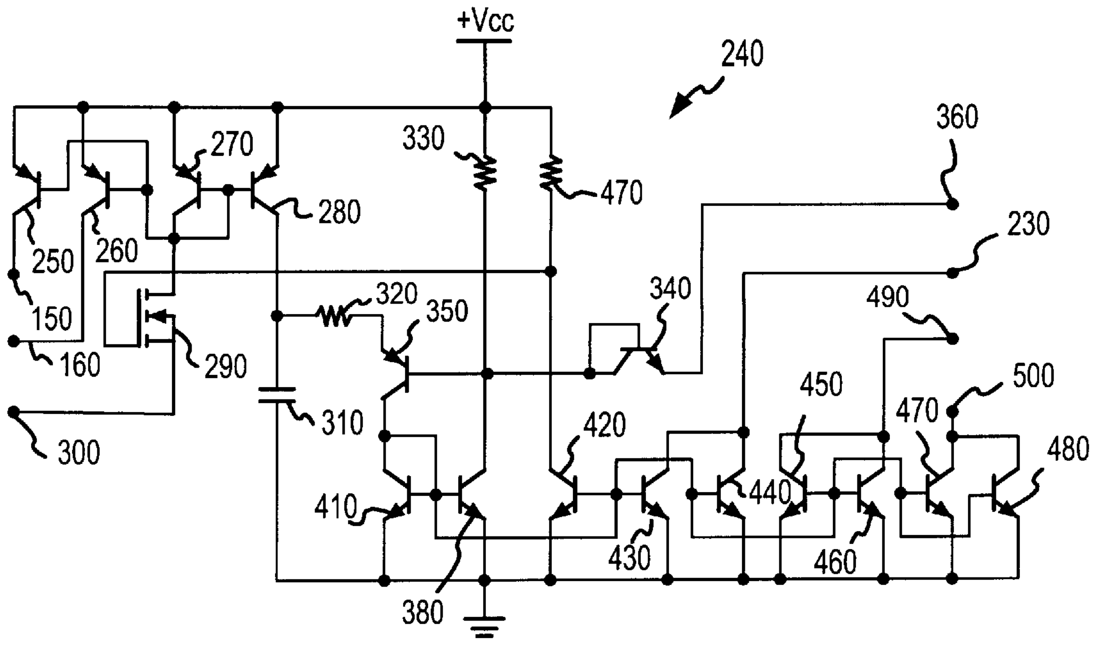
FIG. 3 is a schematic diagram of two complementary current mirrors connected together by a charge storage circuit according to the invention.

FIG. 3 illustrates another embodiment of a network node, referred to as a pulse-mode node 240. For convenience of illustration, elements that are identical to those in FIG. 2 will use the same reference numerals. As with the other network nodes, node 240 may be used in constructing a computing network. Current is inputted to the current mirror formed by transistors 250, 260, 270 and 280 via a transistor 290. An input 300 to transistor 270 is provided, and is mirrored by transistors 250 and 260 to provide for positive feedback and feedforward, respectively. Transistor 280 outputs its mirrored current to capacitor 310. resistors 320 and 330, a transistor 340 and a transistor 350 turn on when the voltage on capacitor 310 is approximately one volt above the trip voltage inputted at input 360. At which time a transistor 380 turns on and capacitor 310 is discharged via transistor 350 into the current mirror comprising transistors 410, 380, 420, 430, 440, 450, 460, 470 and 480. This discharge into the current mirror causes the inverter circuit of a resister 470 and transistor 420 to switch from a high voltage to a low voltage which in turn turns off transistor 290 to inhibit any further input to the current mirror comprising transistors 250, 260, 270 and 280. Transistor pair 430 and 440 now mirrors the discharge from capacitor 310 to provide the output from the node, whereas transistor pairs 450 and 460 and pairs 470 and 480 sink an equivalent current 490 for connection within a network as negative feedforward, and an equivalent current 500 for connection within a network as negative feedback, respectively. When capacitor 310 has been discharged, inverter circuit transistor 420 and resistor 470 now changes state and the transistor is once again turned on and allows current to be inputted as initially.

Figure 4:
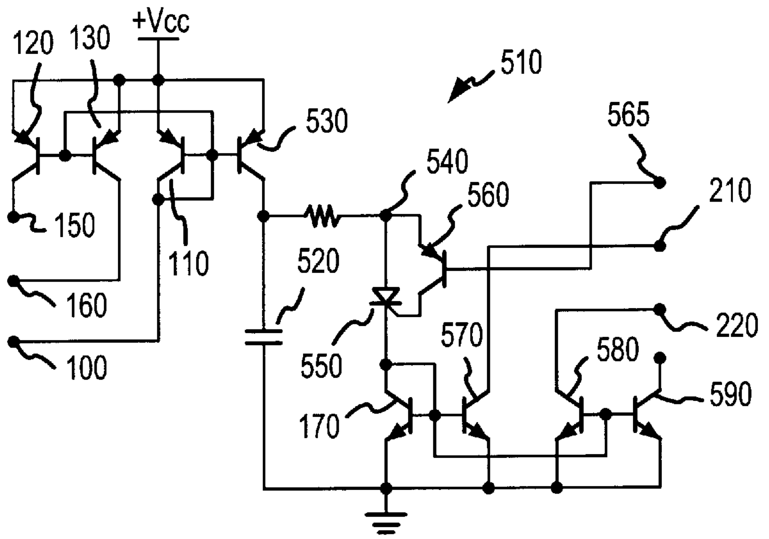
FIG. 4 schematically illustrates an alternative embodiment of two complementary current mirrors connected together by a charge storage circuit according to the invention.

FIG. 4 shows another implementation of a pulse-mode node 510 from which a computing network may be constructed. It is equivalent to the analog node of FIG. 2 (and for convenience of illustration will use the same reference numeral for identical elements) in which a charge storage circuit comprising a capacitor 520 is charged by the mirrored current from a transistor 530. A resistor 540, a SCR 550 and a transistor 560 form a discharge path from capacitor 520 that turns on when the voltage on capacitor 520 reaches approximately one volt above the trip voltage inputted at an input 565. This current discharge is then mirrored by transistors 570, 580, and 590 to provide the requisite outputs as described for FIG. 2.

Figure 5:
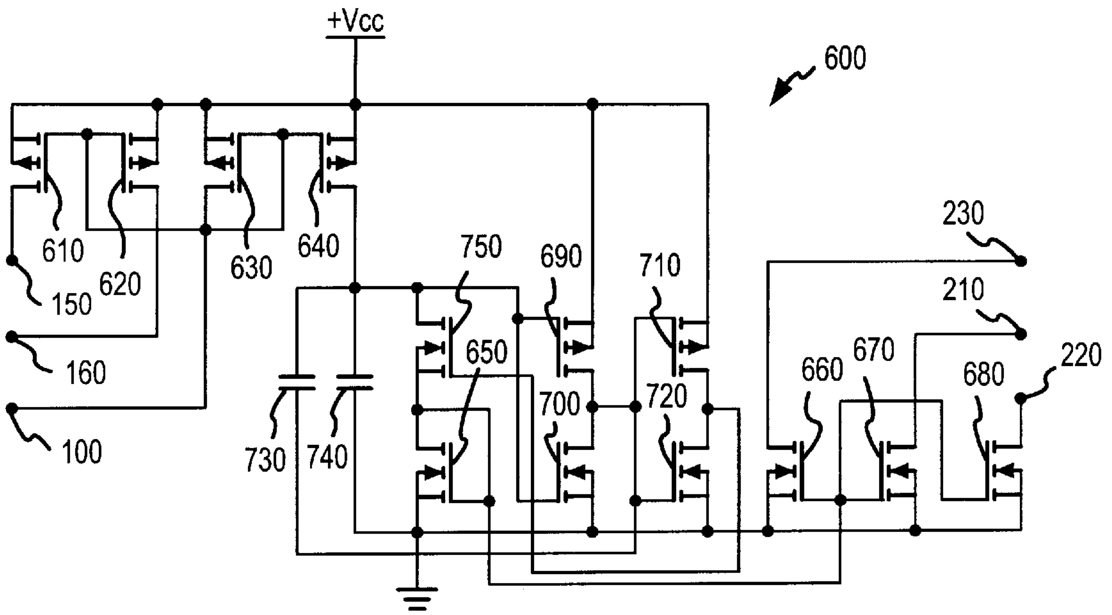
FIG. 5 schematically illustrates an alternative embodiment of two complementary current mirrors implemented as MOS transistors connected together by a charge storage circuit according to the invention.

FIG. 5 shows another implementation of a pulse-mode node 600 from which a computing network may be constructed according to the invention, but constructed from MOS transistors. For convenience of illustration, elements that are the same as in FIG. 2 will use the same reference numerals. Node 600 includes transistors 610, 620, 630 and 640 for the first current mirror with inputs as previously described in FIG. 2. Transistors 650, 660, 670, and 680 form the second current mirror with outputs as described in FIG. 2. Transistors 690 and 700 and transistors 710 and 720 each form inverters which provide for the periodic discharging of capacitors 730 and 740 via a transistor 750, to transfer stored charge to the second current mirror.

Figure 6:
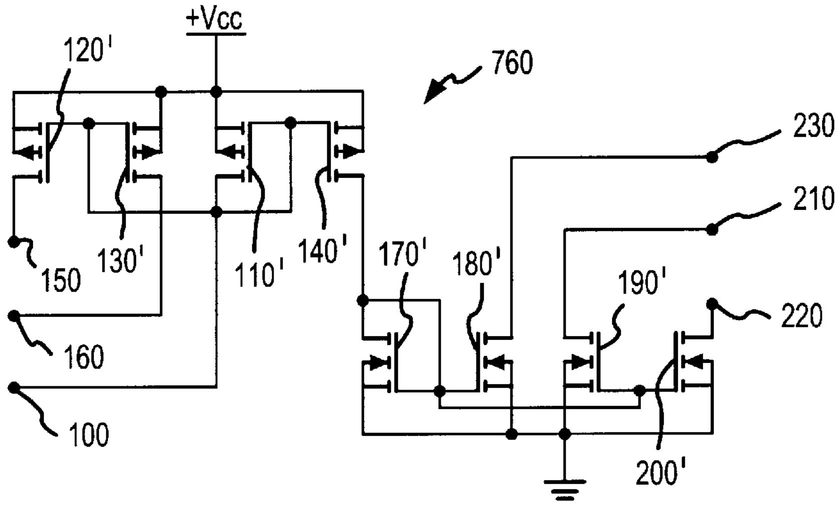
FIG. 6 schematically illustrates an alternative embodiment of two complementary current mirrors implemented as MOS transistors according to the invention.

FIG. 6 shows another implementation of a pulse-mode node 760 from which a computing network may be constructed according to the invention, but constructed from MOS transistors completely analogous to the bipolar transistor circuit as shown in FIG. 2 as designated by a "'" after the reference numeral.

Figure 7:
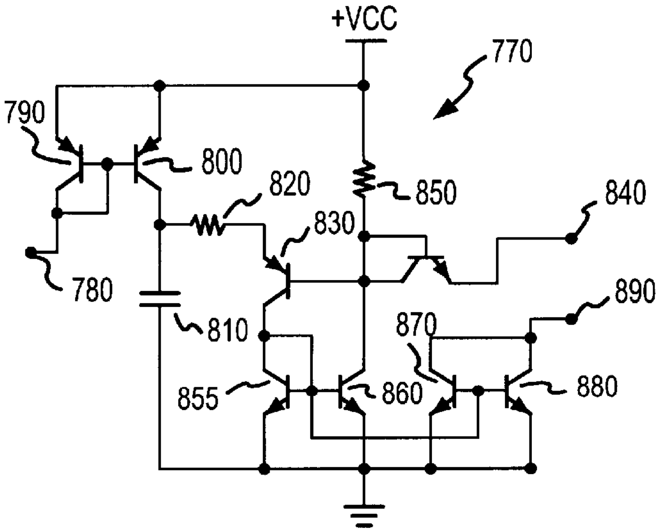
FIG. 7 schematically illustrates a frequency mode input node where the frequency of the pulse train is used to encode a desired value according to the invention.

FIG. 7 illustrates another form of an input node 770 that may be used to input signals into a computing network according to the invention. Current is inputted at 780 and is mirrored by a transistor pair 790 and 800 to charge a capacitor 810. A resistor 820 and a transistor 830 form a discharge path from capacitor 810 that turns on when the voltage on capacitor 810 reaches approximately one volt above the trip voltage inputted at 840. A transistor 855 is initially held off by a resistor 850 and only turns on when a transistor 860 starts to conduct. This current discharge is then mirrored by a transistor 870 and 880 to provide an output pulse at 890. Similar current controlling devices as described for FIGS. 1*a*, 1*b*, 1*c* and 1*d* may alternatively be used, but applicable methods are not limited to these.

Figure 8A:
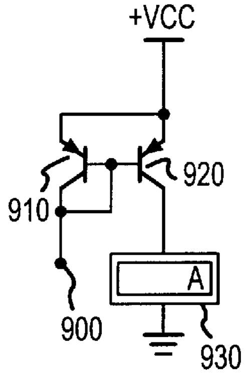
FIGS. 8_a,_ 8_b,_ 8_c_ & 8_d_ illustrates various schematic diagrams of output nodes according to the invention.
Figure 8B:
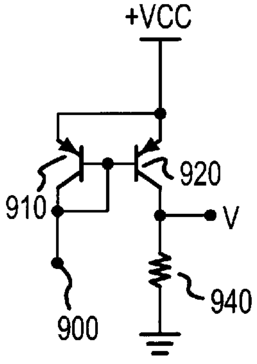
Figure 8C:
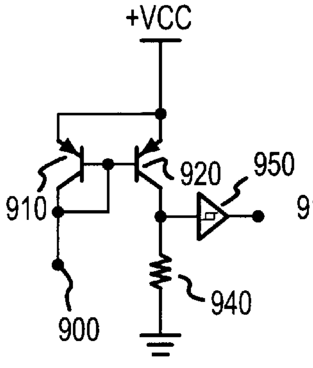
Figure 8D:
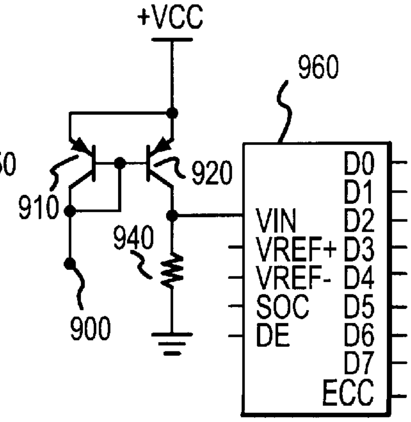

FIGS. 8*a*, 8*b*, 8*c* and 8*d* illustrate alternative output nodes according to the invention. In FIG. 8*a*, current from the last level of network processing nodes (not shown) is inputted at 900, mirrored by a transistor pair 910 and 920 and read out as a current by a meter 930. FIG. 8*b* is equivalent to FIG. 8*a* but where the output current from the current mirror is converted to a voltage V by a resistor 940. FIG. 8*c* uses a Schmitt buffer 950 to convert the output current to a binary state, and FIG. 8*d* uses a analog to digital converter IC 960 to give a higher order binary output.

Figure 9:
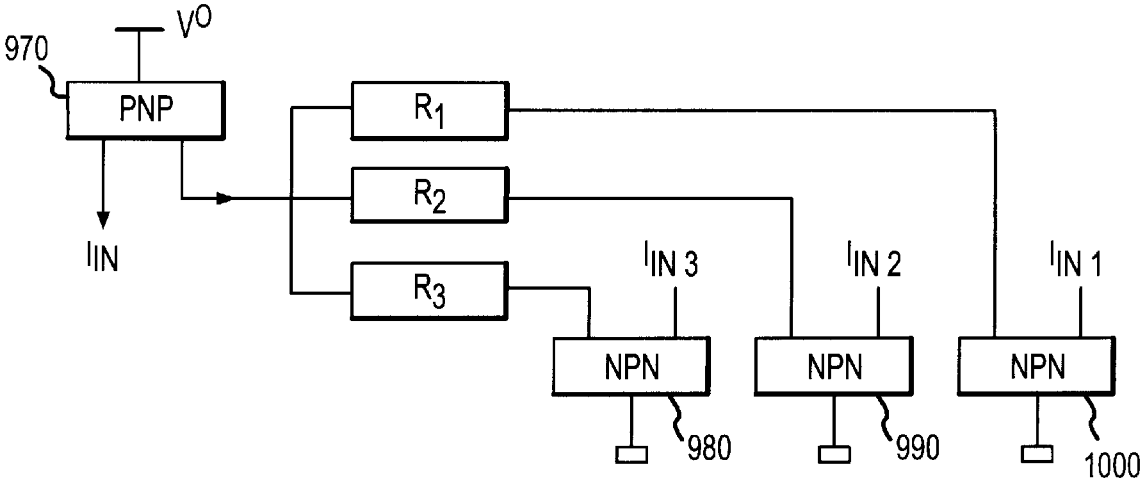
FIG. 9 schematically illustrates a current distribution principle applicable to the interconnection between complementary current mirrors of a network according to the invention.

FIG. 9 demonstrates the underlying principle which allows complementary current mirrors to be connected together into an extended network. In FIG. 9, a current input to a first current mirror 970, shown herein as comprising bipolar PNP transistors, is mirrored to the three NPN transistor current mirrors 980, 990 and 1000, with the constraint that the sum of the three input currents is equal to the output from mirror 970 and therefore equal to the original input current $I_{in}$. Furthermore, each of the individual currents now outputted by mirrors 980, 990 and 1000 is a proportion of the total current or input current $I_{in}$ according to the relationships as shown. This also illustrates that the absolute value of the individual resistors, $R_1$, $R_2$, and $R_3$ is not important. Rather, the relative values of these resistors is important.

Figure 11:
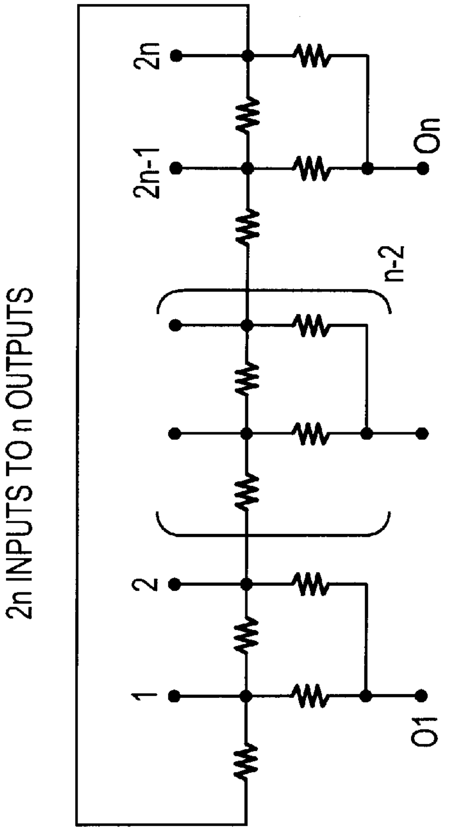
FIGS. 10, 11 & 12 schematically illustrate resistive networks according to the invention.
Figure 10:
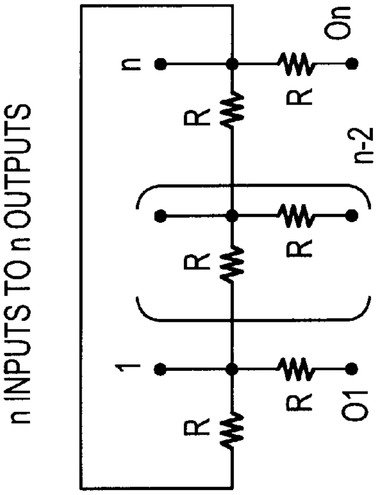
Figure 12:
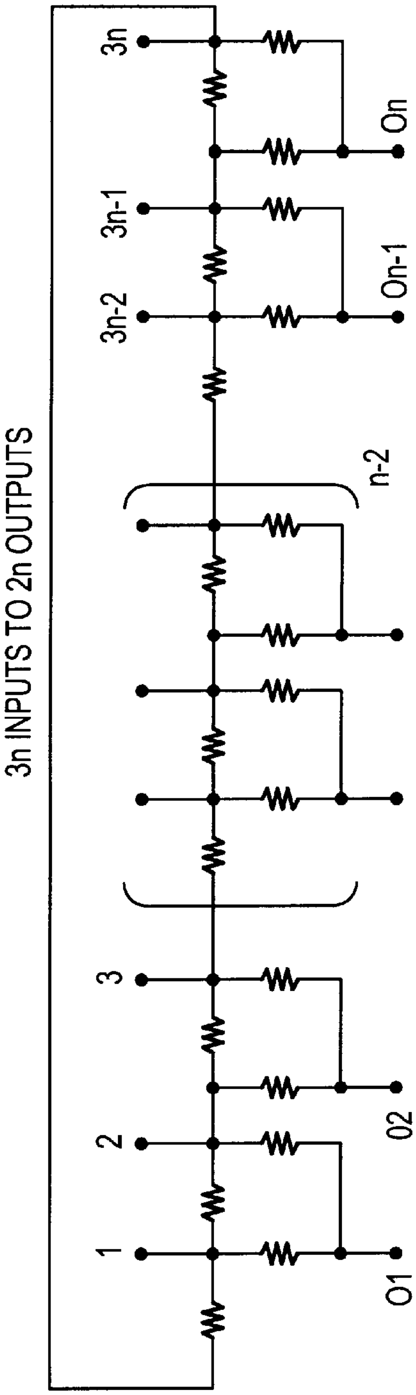

As previously described, the networks of the invention are resistive networks, with the network nodes being resistively connected together. FIGS. 10–12 illustrate various resistive networks that may be employed with the network nodes of the invention. In FIG. 10, a simple resister network is shown having resistors R (with the resister value being independent) which may be employed to couple n inputs 1 to n to n outputs O1 to On. FIG. 11 shows another resister network, absolute value independent, according to the invention to couple inputs 1 to 2n to n outputs O1 to On. FIG. 12 shows another resister network, absolute value independent, according to the invention to couple inputs 1 to 3n to n outputs O1 to On.

Figure 13A:
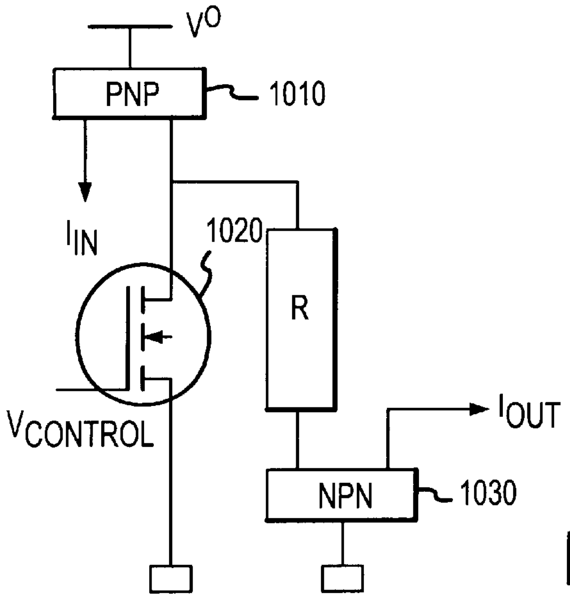
FIGS. 13_a,_ 13_b,_ and 13_c_ schematically illustrate various attenuation methods applicable to a current signal transferred between complementary current mirrors according to the invention.

FIG. 13 shows how external derived signals into the connection between complementary current mirrors can influence the transfer of current from a first mirror to a second mirror. More specifically FIG. 13*a* illustrates the input current $I_{in.}$ mirrored by a first current mirror 1010 proportionated between a transistor 1020 and a resistor R according to a non-linear relationship $I_{out}=f(V_{control}, R)$. The fraction of this current through resistor R then appears at the output of a mirror 1030.

Figure 13B:
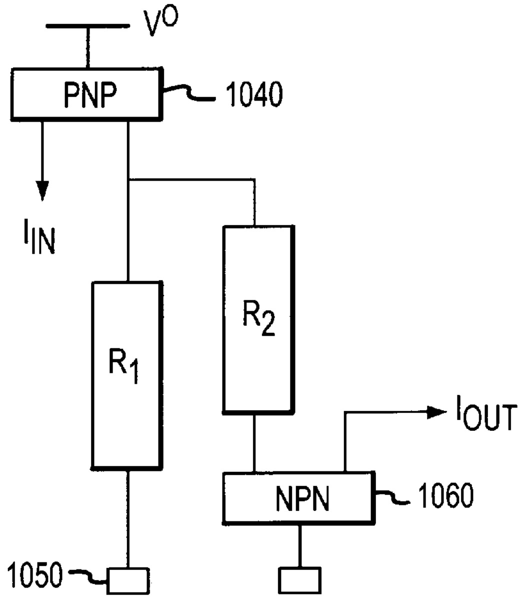

FIG. 13*b* is analogous to FIG. 13*a* and shows the input current $I_{in.}$ mirrored by a first current mirror 1040 proportionated between a resistor R1 grounded at 1050 and a resistor R2 according to a non-linear relationship $I_{out}=f(R1, R2)$. The fraction of this current through resistor R2 then appears at the output of a mirror 1060.

Figure 13C:
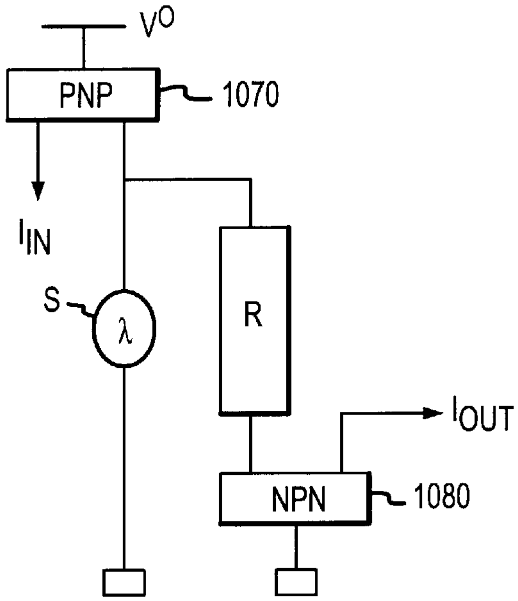

FIG. 13*c* is analogous to FIG. 13*a* and shows the input current $I_{in.}$ mirrored by a first current mirror 1070 proportionated between a sensor S and a resistor R according to a non-linear relationship $I_{out}=f(S, R)$. The fraction of this current through resistor R then appears at the output of a mirror 1080 and varies as sensor S responds to an external signal.

Figure 14:
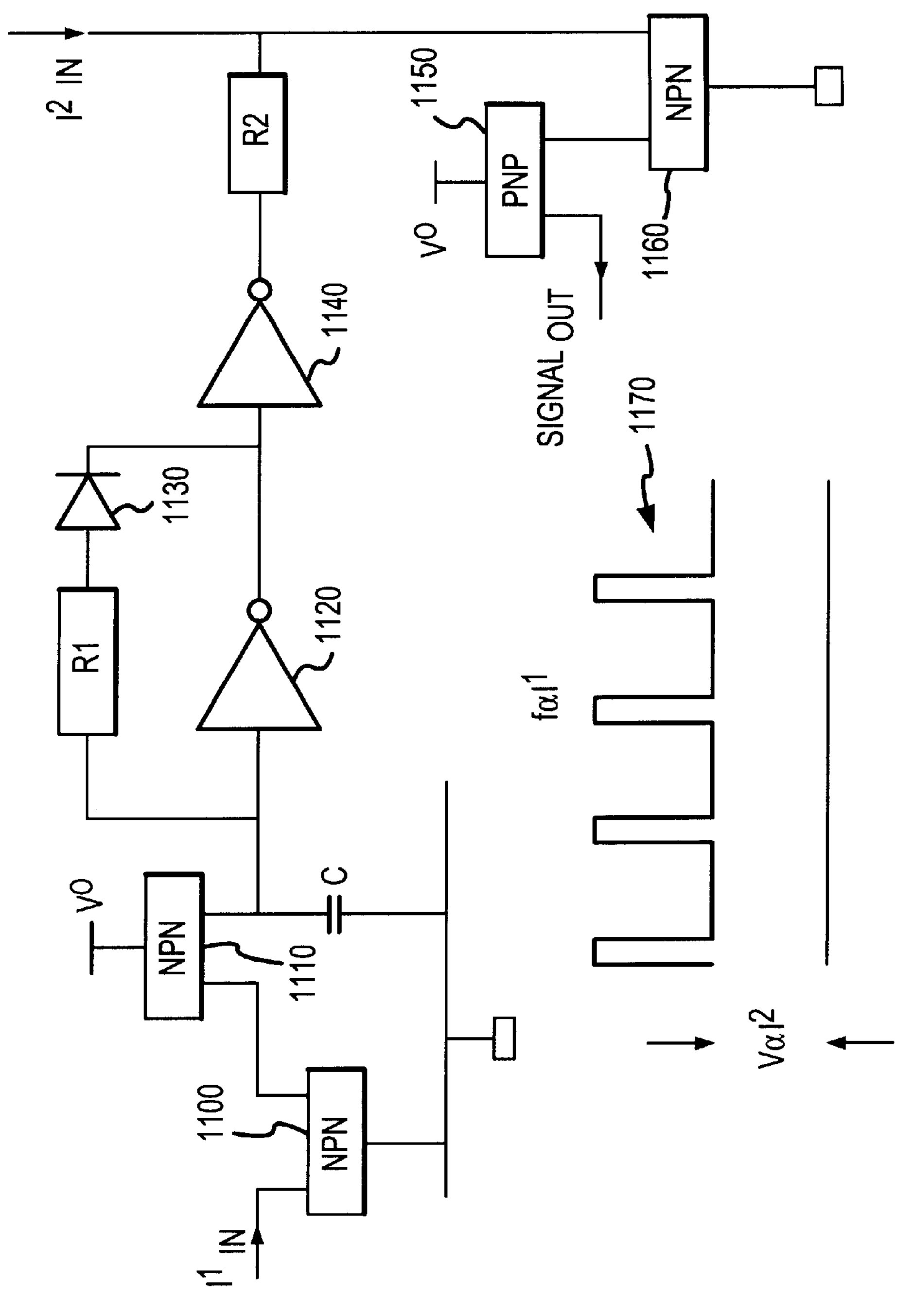
FIG. 14 illustrates an exemplary mixed input node according to the invention.

FIG. 14 illustrates circuit implementations of another network node 1090, which includes pulse-mode nodes (similar to FIG. 3, for example) and analog-mode nodes (similar to FIG. 2, for example), and for which the output now contains a component which reflects the use of mixed mode nodes. More specifically, an input current $I^1$ is inputted to complementary current mirrors 1100 and 1110 where it charges a capacitor C. At some voltage on the capacitor C equivalent to the lower switching threshold of a first Schmitt inverter 1120, this buffer changes state to give a low output and therefore capacitor C discharges through a diode 1130 and a resistor R1. At the same time, the a second inverter 1140 changes state and passes a current to complementary current mirrors 1150 and 1160. This current is summed at the summing junction of mirror 1160 with current $I^2$ to give a current output of the form as shown in graph 1170, where pulses of frequency proportional to current $I^1$ are superimposed on current $I^2$.

Figure 15:
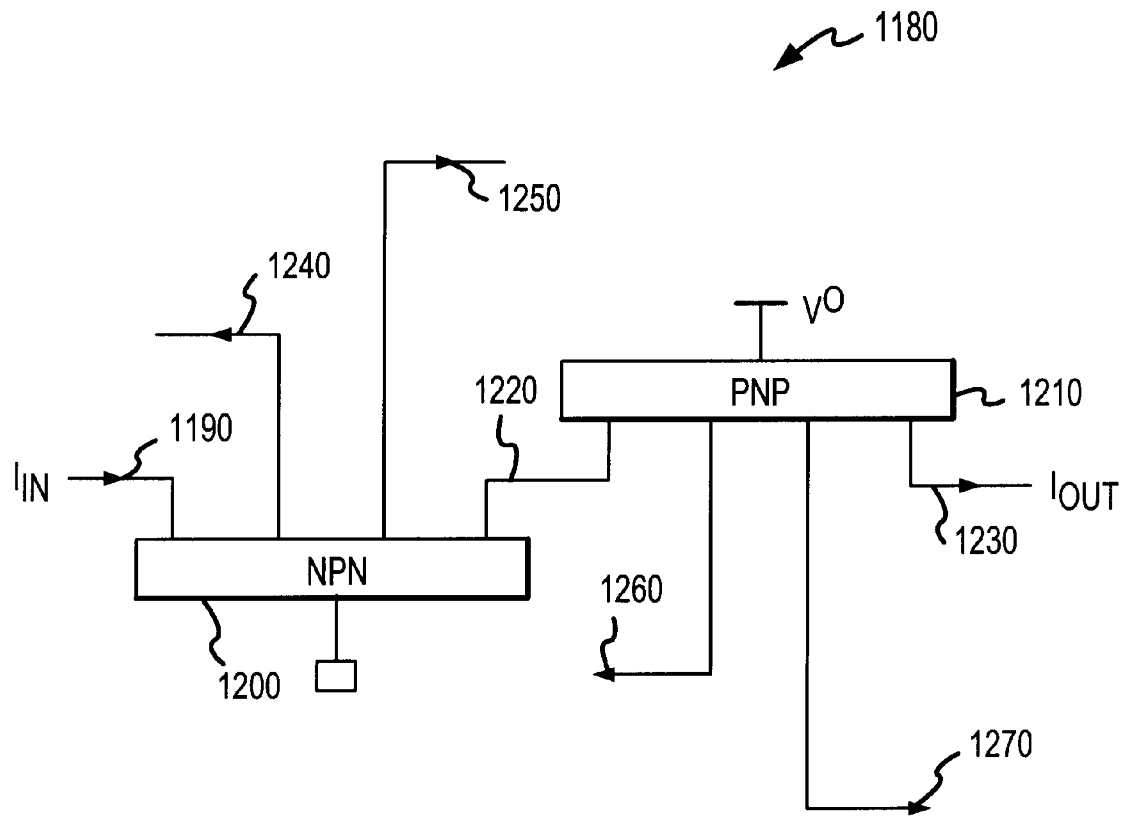
FIG. 15 is a schematic diagram of a complementary current node according to the invention.

FIG. 15 summarizes schematically a fully functional network analog node 1180 of the form that would be useful in constructing extensive arrays of nodes to form a complex computer or processor. More specifically, with node 1180, a current 1190 is inputted to a mirror 1200 which is connected to a mirror 1210 by a connector 1220 to give an output current 1230 essentially equivalent to the input current 1190. At the same time, the input current 1190 is additionally mirrored twice at 1240 and 1250 and provides negative feedback and feedforward current sinks, respectively. Similarly, the input current is mirrored twice at 1260 and 1270 and provides positive feedback and feedforward current sources, respectively.

Figure 16:
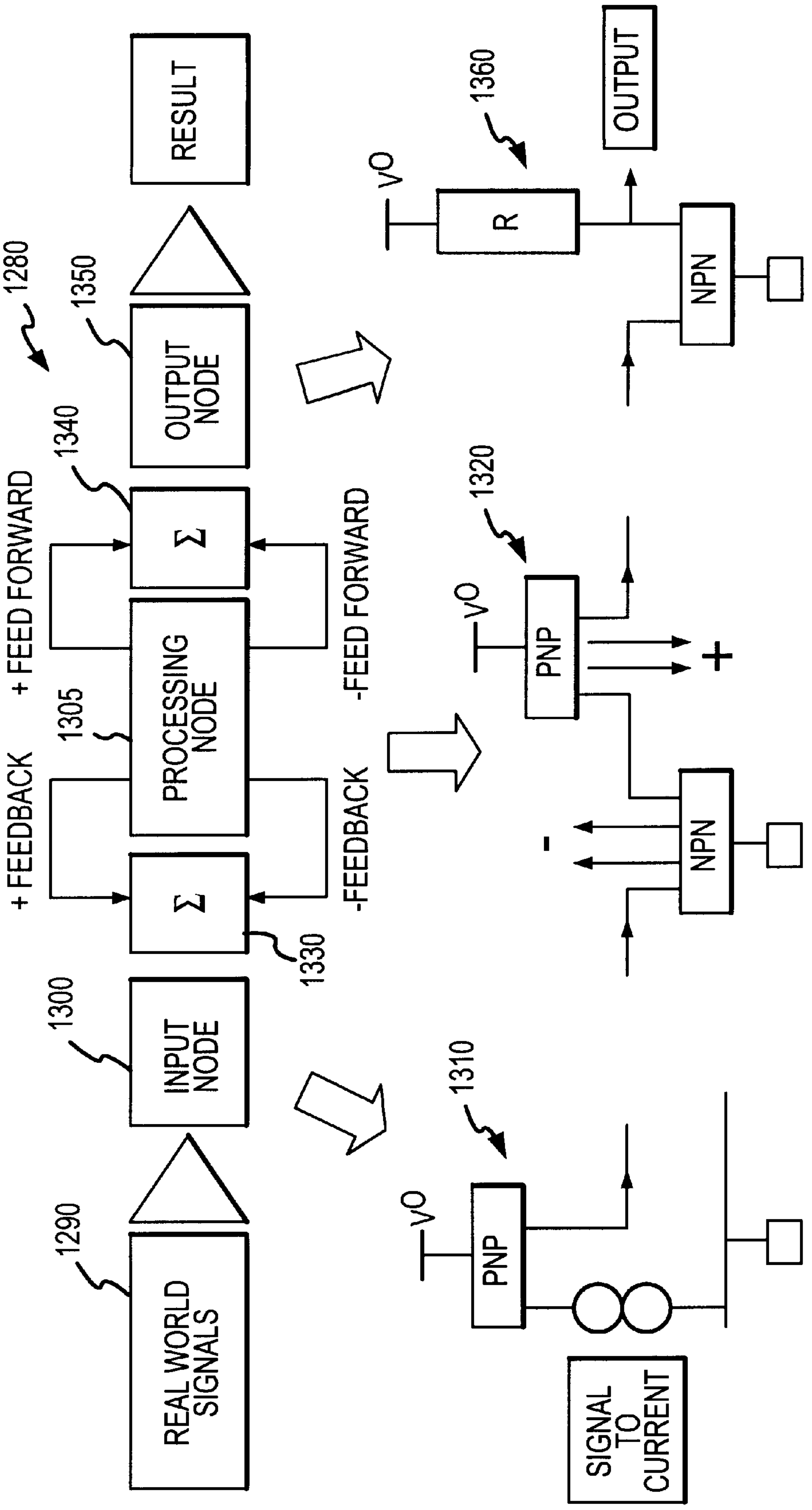
FIG. 16 is a schematic diagram that illustrates the signal flow through a network of complementary current mirror nodes according to the invention.

As previously described, the computing networks of the invention may use an assortment of input nodes, network nodes and output nodes. FIG. 16 illustrates one relationship between such input nodes, network or processing nodes and output nodes to implement a single processing layer analog computing network 1280. Also shown schematically is the directionality of the positive feedback and feedforward as well as the directionality of the negative feedback and feedforward. More specifically, real world signals or appropriate input values to represent the parameters of the problem to be computed are represented by a block 1290. These signals are inputted to a layer of individual input nodes as represented by block 1300 (of which a node 1310 is shown one type of individual node that may be used in a manner similar to that previously described in FIG. 1) which in turn are connected to the inputs of a processing node layer 1305 (typified by a diagram 1320 in a manner similar to that described in connection with FIG. 15) via summing junctions 1330. In all cases, connections between the node layers, input, processing and output, are resistive using one of the many possible resistance networks know to those skilled in the art, including those described herein. Also shown in FIG. 16 is the directionality of the positive and negative feedback and feedforward, also connected resistively to the appropriate summing junctions. The output of processing nodes 1305 are further connected resistively to input summing junctions 1340 of an output node layer 1350 (with diagram 1360 illustrating one example of an individual output node similar to that described in FIG. 8).

Figure 17:
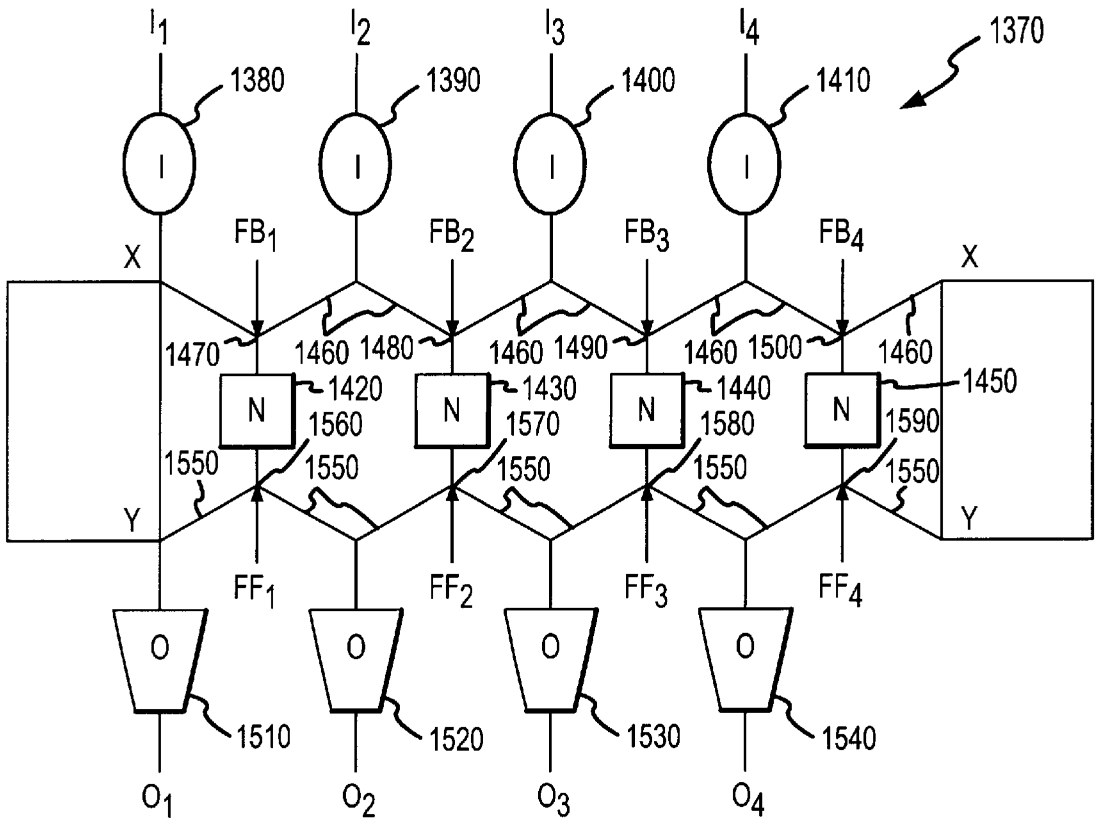
FIG. 17 is a schematic diagram showing the interconnection relationship between input nodes, a resistance network, signal-processing nodes, a second resistance network and output nodes according to the invention.

FIG. 17 shows another schematic representation of an analog-computing network 1370 according to the invention for the case of four input nodes, four processing nodes and four output nodes. More specifically, inputs $I_1$, $I_2$, $I_3$ and $I_4$ are inputted to input nodes 1380, 1390, 1400 and 1410 which are in turn connected to the inputs of processing nodes 1420, 1430, 1440 and 1450 by a resistive network 1460 connected in turn to respective summing junctions 1470, 1480, 1490 and 1500. Outputs from the processing nodes are in turn connected to the input summing junctions of an output node layer comprising nodes 1510, 1520, 1530 and 1540 by a resistive network 1550. For simplicity only the points 1470, 1480, 1490 and 1500 for connecting the respective feedback $FB_1$, $FB_2$, $FB_3$ and $FB_4$ (in a manner similar to that described in connection with FIG. 16) are shown. In an analogous manner, points 1560, 1570, 1580 and 1590 for connecting the feedforward $FF_1$, $FF_2$, $FF_3$ and $FF_4$ are also shown. In practice, feedback and feedforward may be connected to their respective locations by a cross point switch to allow the network to be programmed according to the particular arrangement of the switch settings appropriate to any given problem.

The invention also provides techniques for assembling a programmable analog computer that comprises an array of complementary current mirrors. One particular feature of the invention is the ability to program an array or network of complementary current mirrors. More specifically, the arrangement of interconnections within the array may be altered or terminated. The manner is which the interconnections are altered or terminated defines a transfer function. Hence, by modifying the interconnections of the array, the array may be programmed to effect different transfer functions.

A variety of techniques may be employed to alter the arrangement of interconnections within the array or to super impose a set of modifying inputs onto the array so as to change the transfer function of all or a part of the array. For example, as shown in FIG. 16, signals are fed forward or backward within the array, and may be altered to effect different transfer functions. As another example, a resistive matrix (see FIG. 17) may be provided, and the resistances between the nodes may be altered.

Figure 18:
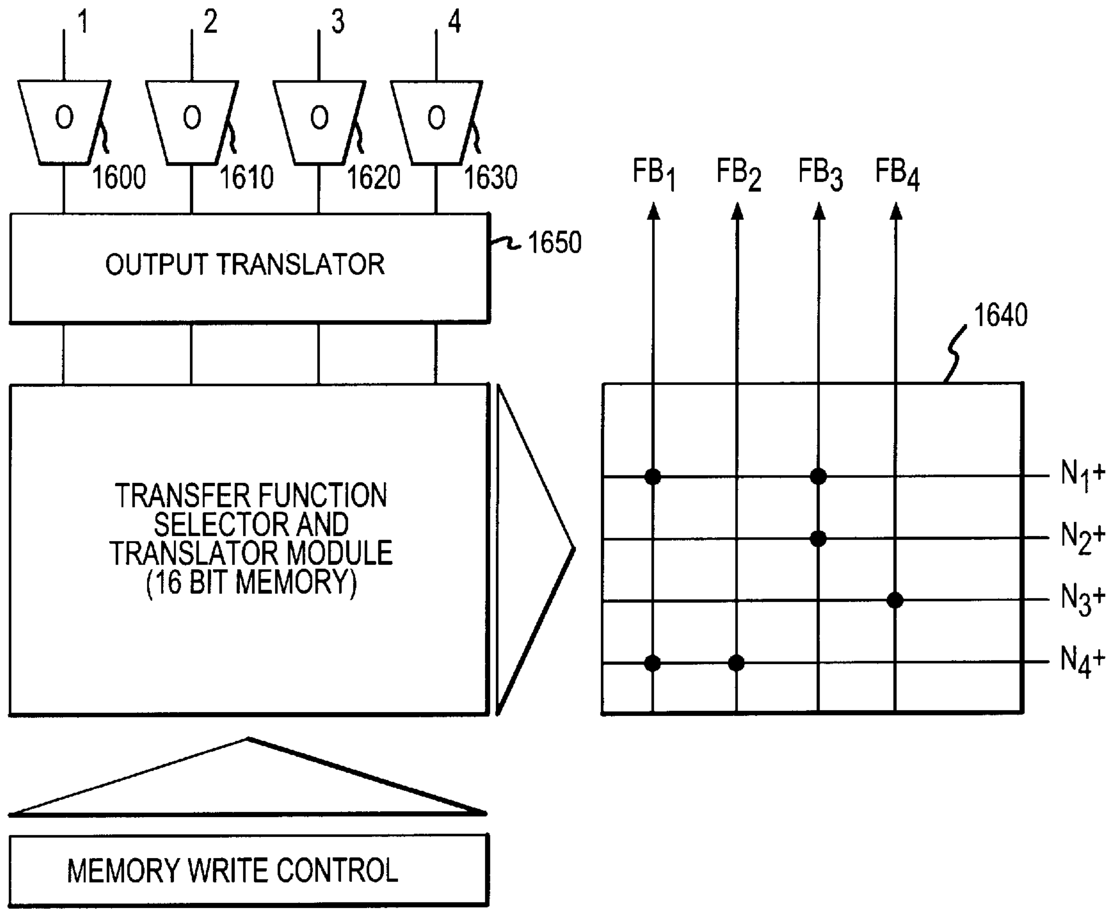
FIG. 18 schematically illustrates an exemplary programmable analog computer according to the invention.

FIG. 18 shows schematically the relationship between the network as described in FIG. 17 and the use of a cross point switch to allow the configuration of the connections of the network to be altered so as to cause the network to process the inputs differently. More specifically, FIG. 18 illustrates a case where the output of output nodes 1600, 1610, 1620 and 1630 are used to determine the connections between the positive feedback from processing nodes $N_1$, $N_2$, $N_3$ and $N_4$ (corresponding to nodes 1420, 1430, 1440 and 1450 in FIG. 17) and the feedback connection points (corresponding to points 1470, 1480, 1490 and 1500 as described in FIG. 17) using a cross point switch 1640. In this example, an output translator 1650 could, for example, select the state of each of the 16 switches which make up the cross point switch 1640, determining the actual state of the interconnections made. Alternatively, for example, a digital computer could also be used to set the state of each of the sixteen switches in cross point switch 1640 providing for external control of the relevant interconnections.

Possible parameters for such the array of FIG. 18 are set forth in Table 1 below.

TABLE 1

| Single Layer Analog Computer Parameters |
|---|
| Number of inputs = 4 |
| Number of outputs = 4 |
| Number of configurations for each cross point switch configurations = 64K($2^{16}$) |
| Total number of transfer functions which could be implemented by a single 4 node, 1 layer network > $10^{19}$ (64K$^4$). |

Figure 19:
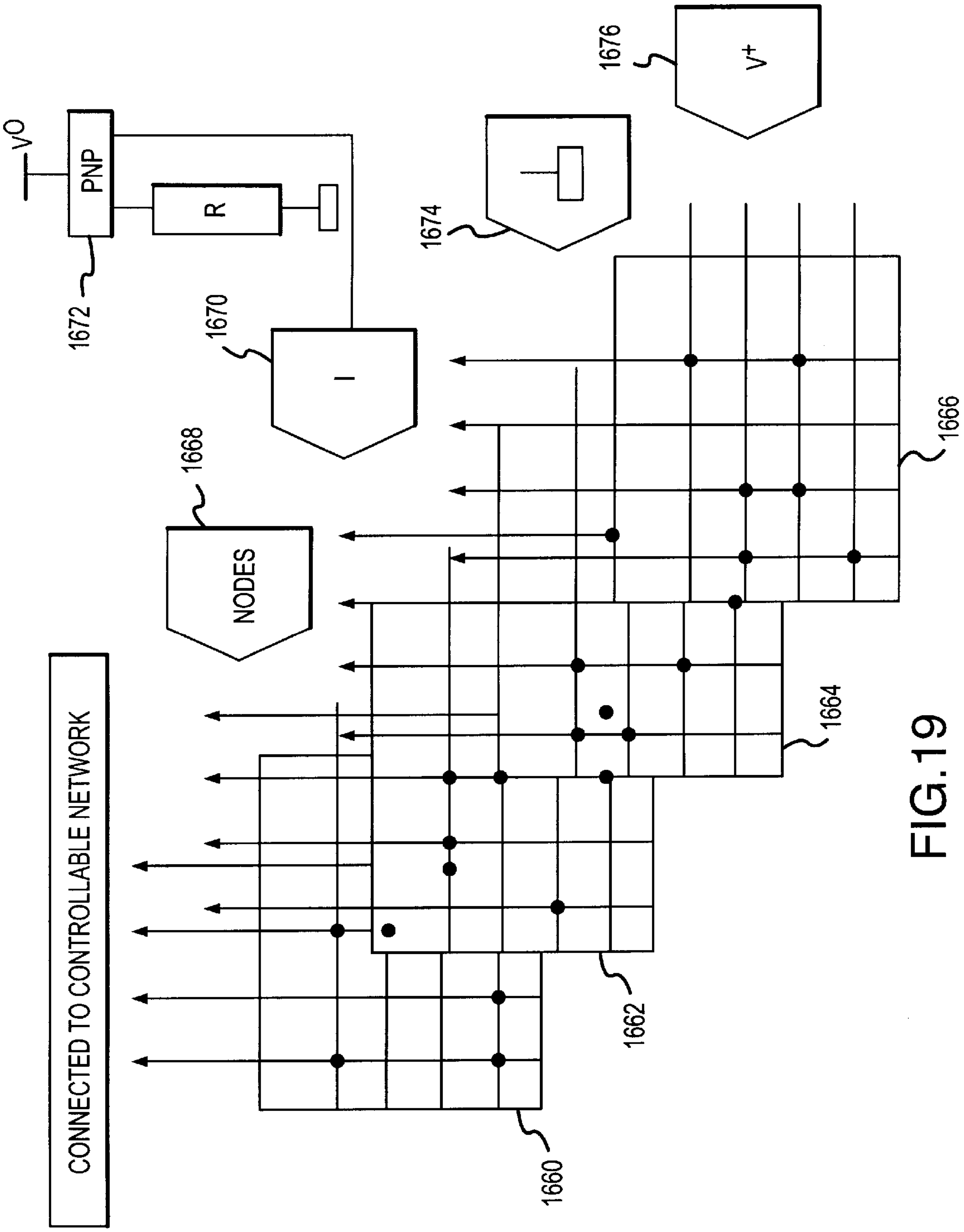
FIG. 19 schematically illustrates an alternative cross point switch arrangement used to connect control voltages to different parts of a current mirror array according to the invention.

In FIGS. 16, 17 and 18 the basic concept of a programmable network of nodes utilizing current mirrors in which cross point switches determined the interconnections between positive and negative feedback and feedforward was illustrated. FIG. 19 schematically shows that a further method of programming an array of nodes is possible and implemented by using additional cross point switches 1660, 1662, 1664 and 1666 to rearrange the interconnections between the nodes 1668 themselves, current from an external current source 1670 (implemented by, for example, a current mirror 1672 and resister R connected as shown) connecting points of the network to ground 1674 or, for example, points of the network to an external voltage 1676.

Figure 20:
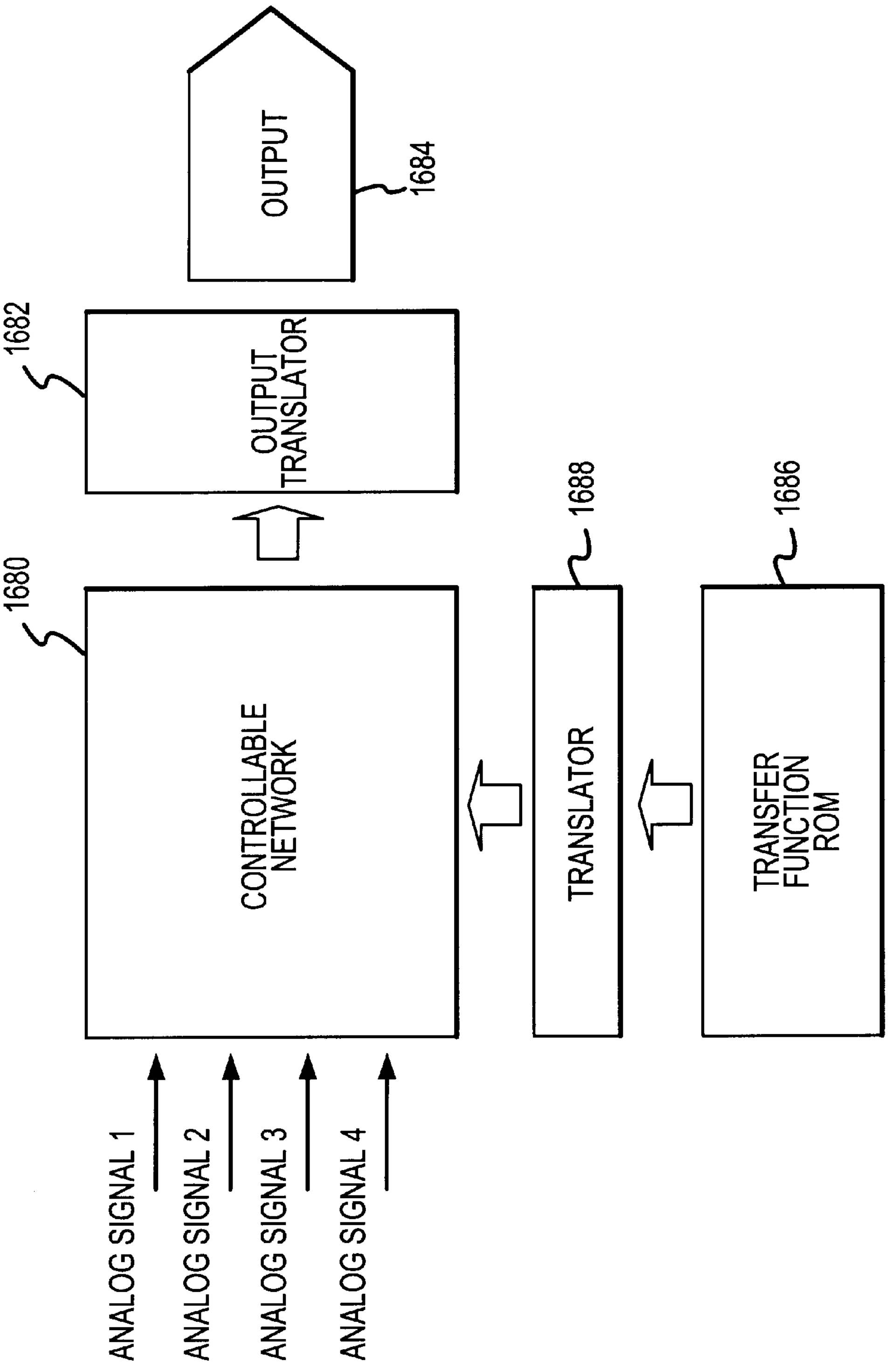
FIG. 20 illustrates a schematic diagram of a fixed program analog computer according to the invention.

FIG. 20 summarizes schematically what was described in FIGS. 16, 17, 18 and 19 in that it shows the signal flow through one possible implementation of a programmable network, and the method of controlling the way in which those signals are processed. Shown in FIG. 20 are analog signals 1, 2, 3 and 4 inputted to a network 1680 from which the signal outputs are translated or interpreted by an output translator 1682 to give the final output 1684. Also shown schematically is the method of configuring or programming the network in that the desired configuration in this example is stored in a transfer function ROM 1686, the state of which is translated by a translator 1688 to set the state of all the cross point switches incorporated into the controllable network 1680.

Figure 21:
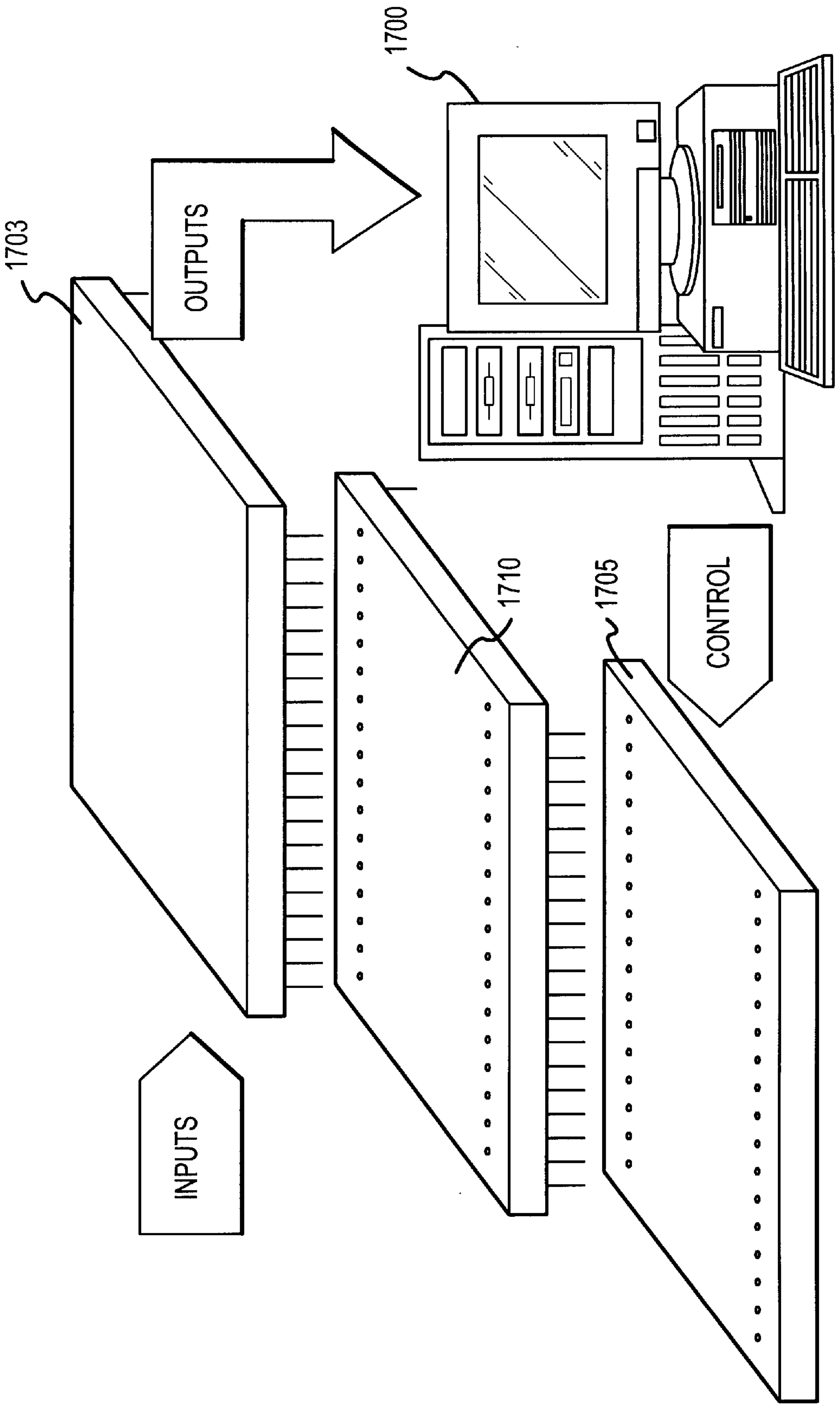
FIG. 21 schematically illustrates an exemplary system having an analog-computing array coupled to a digital computer to search for possible interconnection configurations according to the invention.
Figure 22:
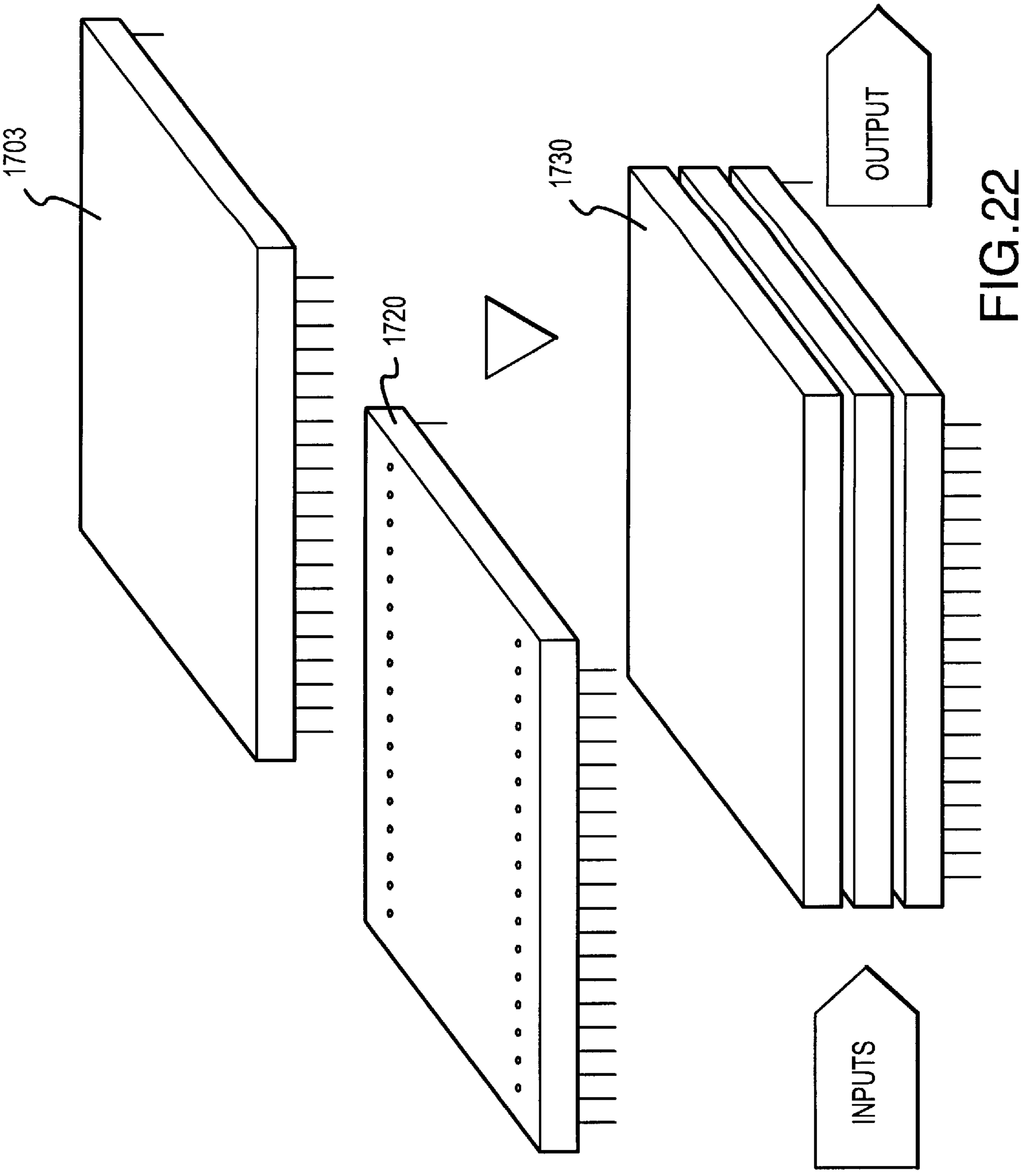
FIG. 22 schematically illustrates an exemplary current mirror array having a preprogrammed cross point switch module according to the invention.

One feature of the invention is the ability of the networks of the invention to "learn" a transfer function. In the case where the applicable transfer function is unknown, an analog computing array may be coupled to a system configured to search through all of the possible configurations for the set of interconnections which give the desired transfer function. For example, as shown in FIG. 21, a conventional computer 1700, such as a Pentium-type computer, may be employed to search through all possible configurations for the desired set of interconnections of an analog network 1703 using a cross point switch programmer 1705 and a cross point switch unit 1710. At the conclusion of the "learning" phase, i.e., when the best transfer function is known, the cross point switch module 1705 may be replaced by, for example, a diode array 1720 or ROM switch unit, in which the desired mode of interconnections is fixed as shown in FIG. 22. At this stage, a composite module 1730 may be assembled which links a configurable computing array with the appropriate interconnection setting unit. In this way, a dedicated, fixed program computing array is provided. An attractive feature of such an arrangement is that the array may be "reprogrammed" by substituting another interconnection setting unit should the need arise.

In other embodiments the invention provides various dynamic programmable analog computing arrays. For some applications it may be desirable to have the transfer function of the array depend dynamically on the state of the present output, i.e., as might be required for speech recognition. For instance, the output from the computing array may be interpreted by an output translator module which in turn controls a transfer function selector mode. In this way, the transfer function applied to the inputs may continually change during the time course of inputting data to the array as shown generally in FIG. 23. Such a process may be employed to train the network and determine its transfer function.

Figure 23:
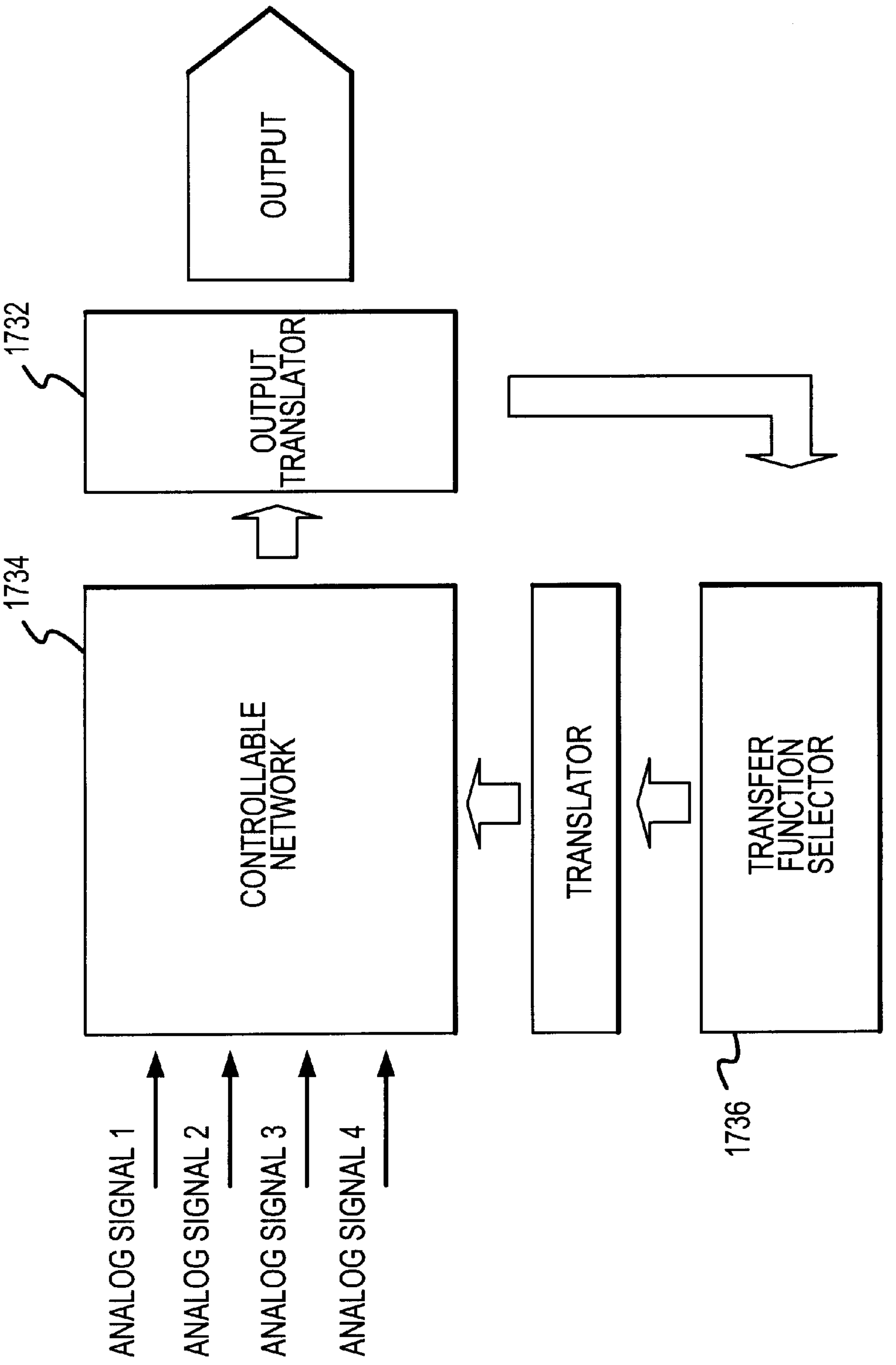
FIG. 23 illustrates a schematic diagram of a dynamically output dependent programmable analog computer according to the invention.

As just described, FIG. 23 shows schematically a further way in which a controllable network may be operated. FIG. 20 illustrated a network in which the state of the network was set independent of the output and controlled by the state of transfer function ROM 1686. In the implementation of FIG. 23, the output from an output translator 1732 is fed back to the network 1734 via a transfer function selector 1736 and thereby determines the state of the network interconnections selected.

Figure 24:
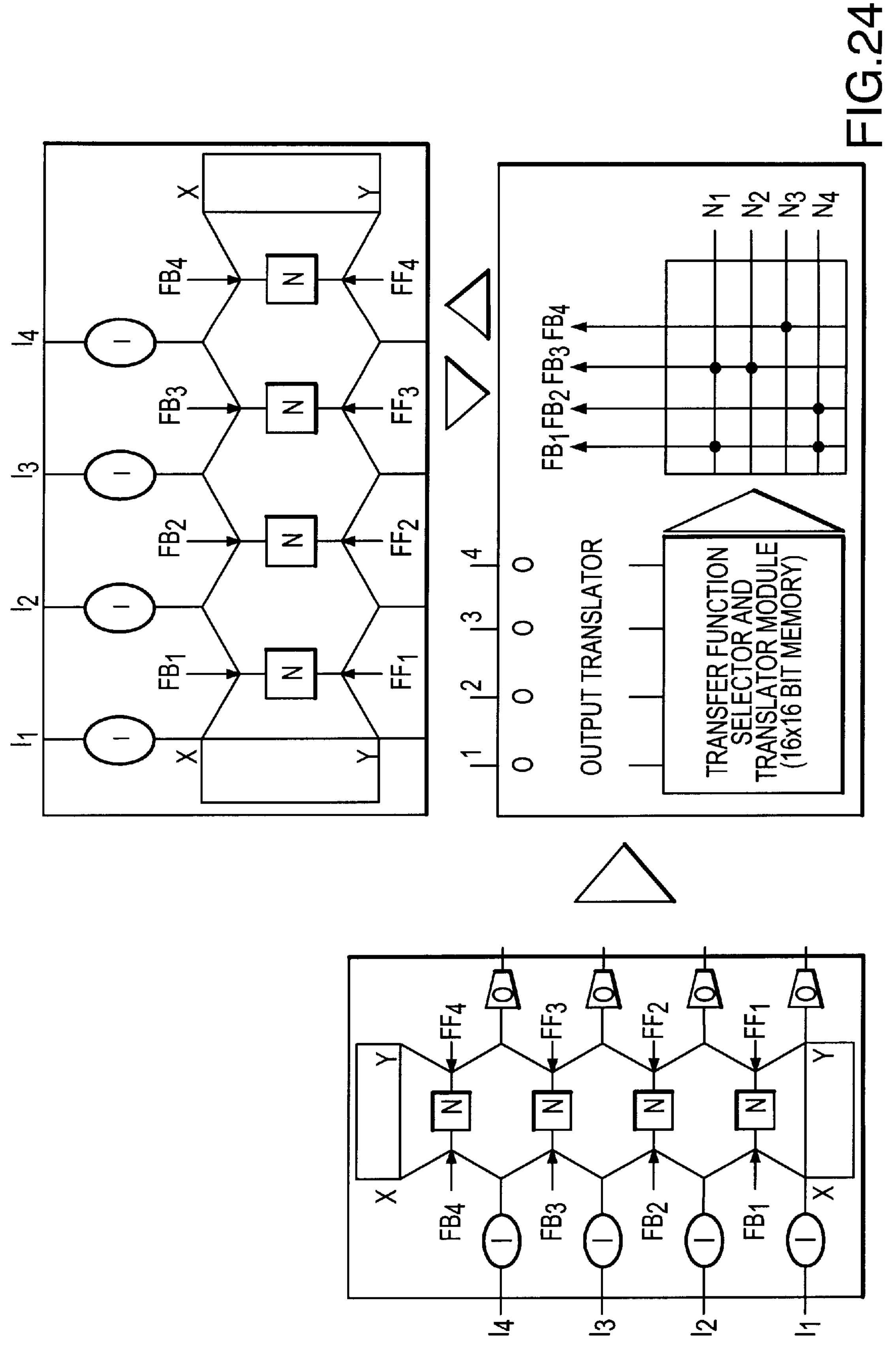
FIG. 24 schematically illustrates two current mirror arrays functioning together in an interacting network according to the invention.

In another implementation, two arrays may be interacted (or "summed") together. For example, one array may be employed to processes the various inputs relating to a computational problem and the second array may be employed to modify the transfer function of the second array according to control inputs presented to the first array as illustrated in FIG. 24.

Figure 25:
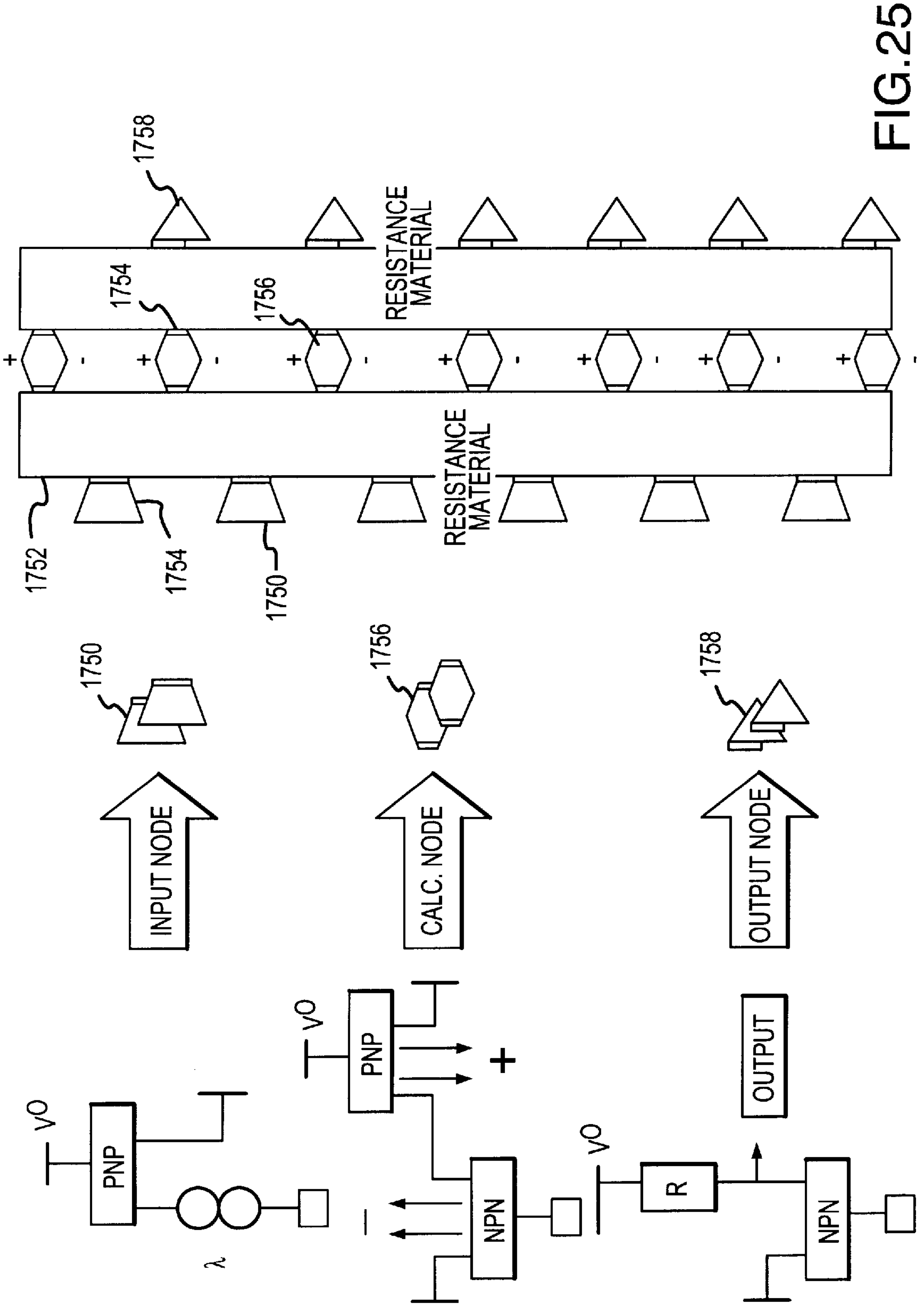
FIGS. 25 and 26 illustrate schematic diagrams of exemplary resistance matrices employed to imbed current mirror configurations according to the invention.
Figure 26:
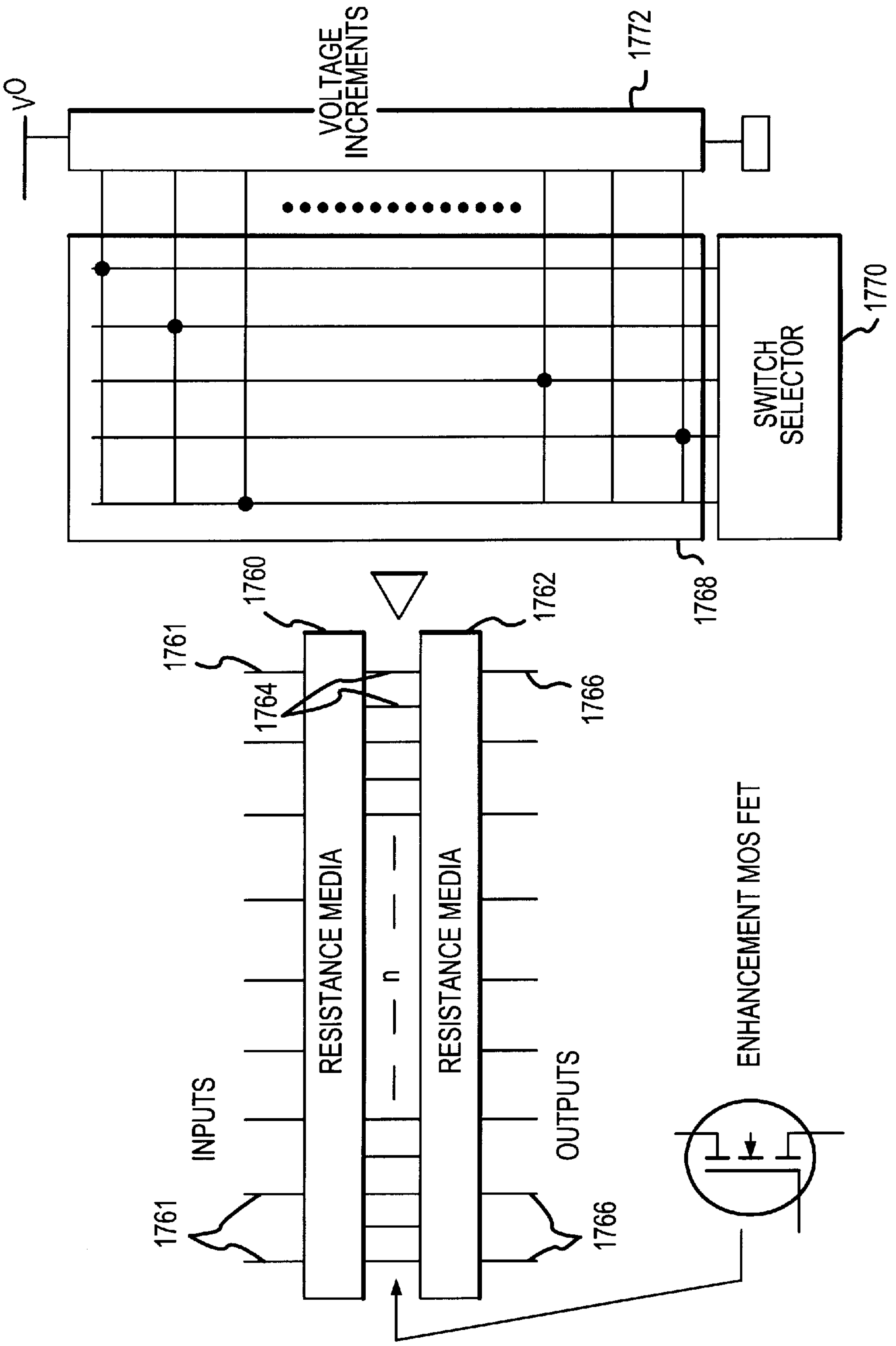

In one particular embodiment, an array of network nodes may be constructed by imbedding the various network nodes within a resistance matrix at the time of manufacture as shown in FIGS. 25 and 26. Such configurations allow a high density of nodes to be achieved, and provides another way to vary the nature of the interconnections between the many nodes of an array. The use of such resistance matrices is advantageous in that the array function is not dependent on the absolute value of the resistance of the interconnections between the individual nodes. Instead, the absolute value of the resistance depends on the ratio of the resistance between interconnections. Hence, shape, uniformity of the doping level, depth of doping, if, for example, the resistance matrix is polysilicon a commonly used conducting material used as part of integrated circuit manufacture. Alternatively, a resistive coating may be used in which case shape, uniformity, depth and the like will dictate the resistance ratios between network connections. A further possible method to produce complex resistance interconnections may be to use overlays of more than one type of resistance matrix.

FIG. 25 shows schematically a possible relationship which implements the concept of a network of nodes interconnected by a resistance matrix. Input nodes 1750 (one form of which is shown in the style described previously) are connected to a resistance matrix 1752, electrically by connections 1754. Processing nodes 1756 (one form of which is shown in the style described previously) are imbedded in the body of the resistance matrix 1752 and electrically connected by connections 1754. Output nodes 1758 (one form of which is shown in the style described previously) are also coupled to thee resistance matrix 1752 by connections 1754 as shown. The arrangement shown provides a signal flow from left to right which takes input signals, and inputs them to a network to derive an output, in which the network-internal signal pathway is via the resistance matrix.

FIG. 26 elaborates on the concept described in FIG. 25 in that it provides a way to change the nature of the resistance matrix used to construct a computing network. Schematically are shown the connections to a resistance matrix 1760 (that is similar to the matrix described in FIG. 25) as inputs 1761. Between segments of the resistance matrix 1760 and 1762 are electrically connected transistor devices 1764 which may comprises, for example, a MOS transistor. Outputs 1766 are shown as the connections that deliver the signal to the next stage in the complete network. The use of MOS transistors as per this example provides for the external control in that these devices allow voltage control of their individual conductance. A cross point switch 1768 may then, for example, provide control of individual device conductance according to the state of a cross point switch selector 1770 and the correspondingly selected voltage from voltage divider 1772.

Figure 27:
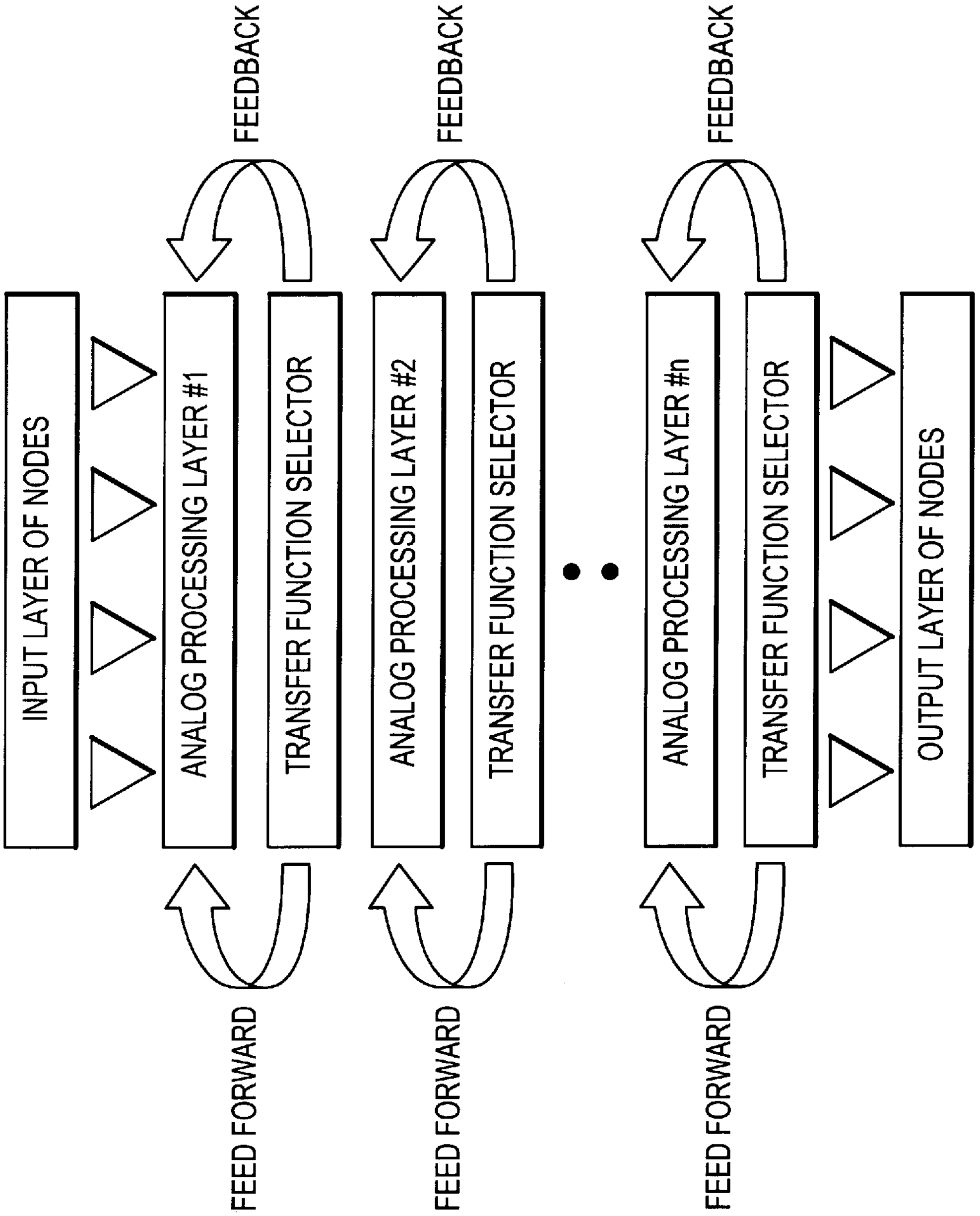
FIG. 27 illustrates a schematic diagram of a system of multiple layer networks according to the invention.
Figure 28:
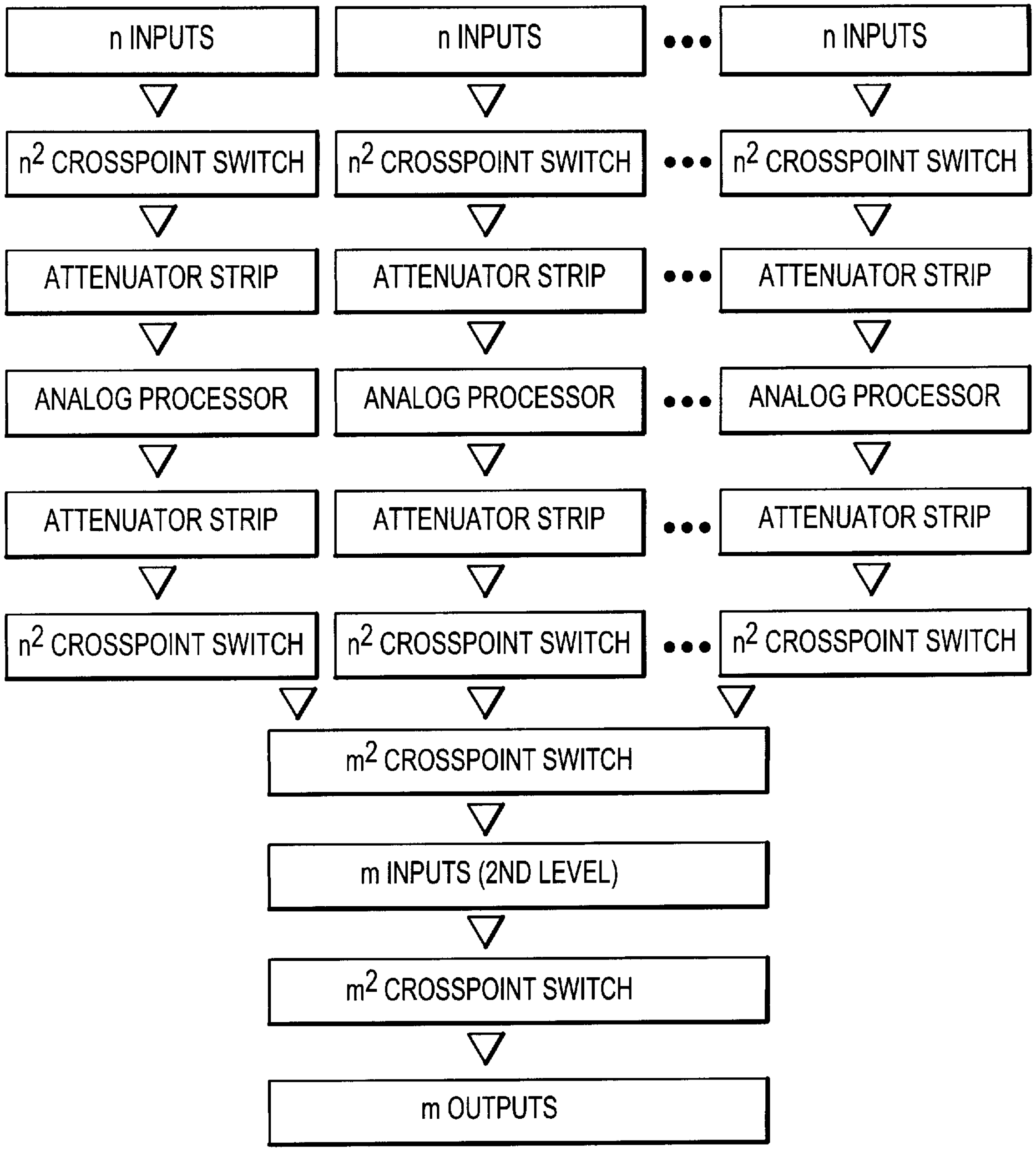
FIG. 28 schematically illustrates a two-level programmable analog computer according to the invention.

In some instances it may not be desirable to achieve the final transformation function for several inputs using a single level of analog computing array nodes. As an alternative, a network may be provided which has multiple levels or layers of processing nodes between the input layer and the output layer as shown generally in FIGS. 27 and 28. It may also be useful in some cases to have larger numbers of input nodes grouped such that the inputs in one group together undergo some transfer function translated into an appropriate output. These intermediate outputs may then be arranged to be the inputs to a further level of an analog computing node layer. In this manner, a way is provided to combine the individual outputs of the first layer into a composite result by the smaller second layer as shown generally in FIG. 28.

Figure 29:
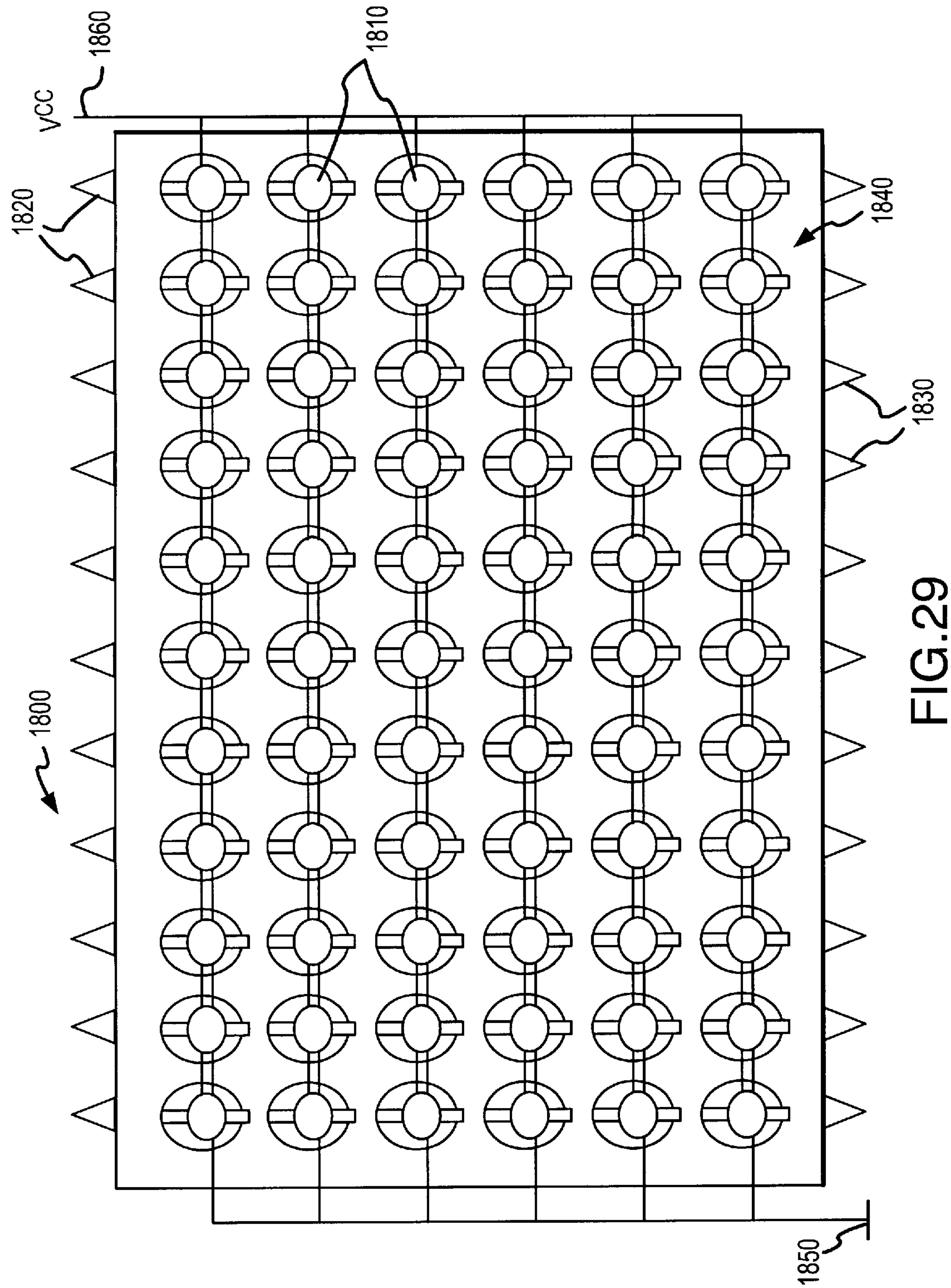
FIG. 29 schematically illustrates an exemplary high-density node matrix according to the invention.

The invention further provides an exemplary high density node matrix 1800 as shown in FIG. 29. In this implementation, an array of network nodes 1810 are provided which each comprise complementary current mirrors as previously described. Nodes 1810 are arrayed such that the interactions between node inputs 1820 and outputs 1830 are via a landscape of a suitable resistance matrix 1840, e.g., polysilicon. Each node 1810 in the matrix 1840 is connected to ground 1850 and a voltage source 1860 by way of a power bus that is electrically isolated from the resistance matrix 1840. Inputs 1820 and outputs 1830 are also electrically connected to the resistance matrix 1840. Inputs 1820 may take the form of either a voltage or a current source, and the latter may be either a measured voltage or current sink as shown generally in FIG. 29. Various transforms of the input data may be implemented depending on the various ways in which input signals are connected to the array inputs 1820.

In a complex network having a rectangular configuration, the current drawn from the supply is two times the net current flow through the network times the average depth of the network in number of current mirror nodes plus one. By depth it is meant the number of middle layers of nodes between the input and output nodes of the network. This is independent of the width of the network in terms of number of input nodes.

Figure 30:
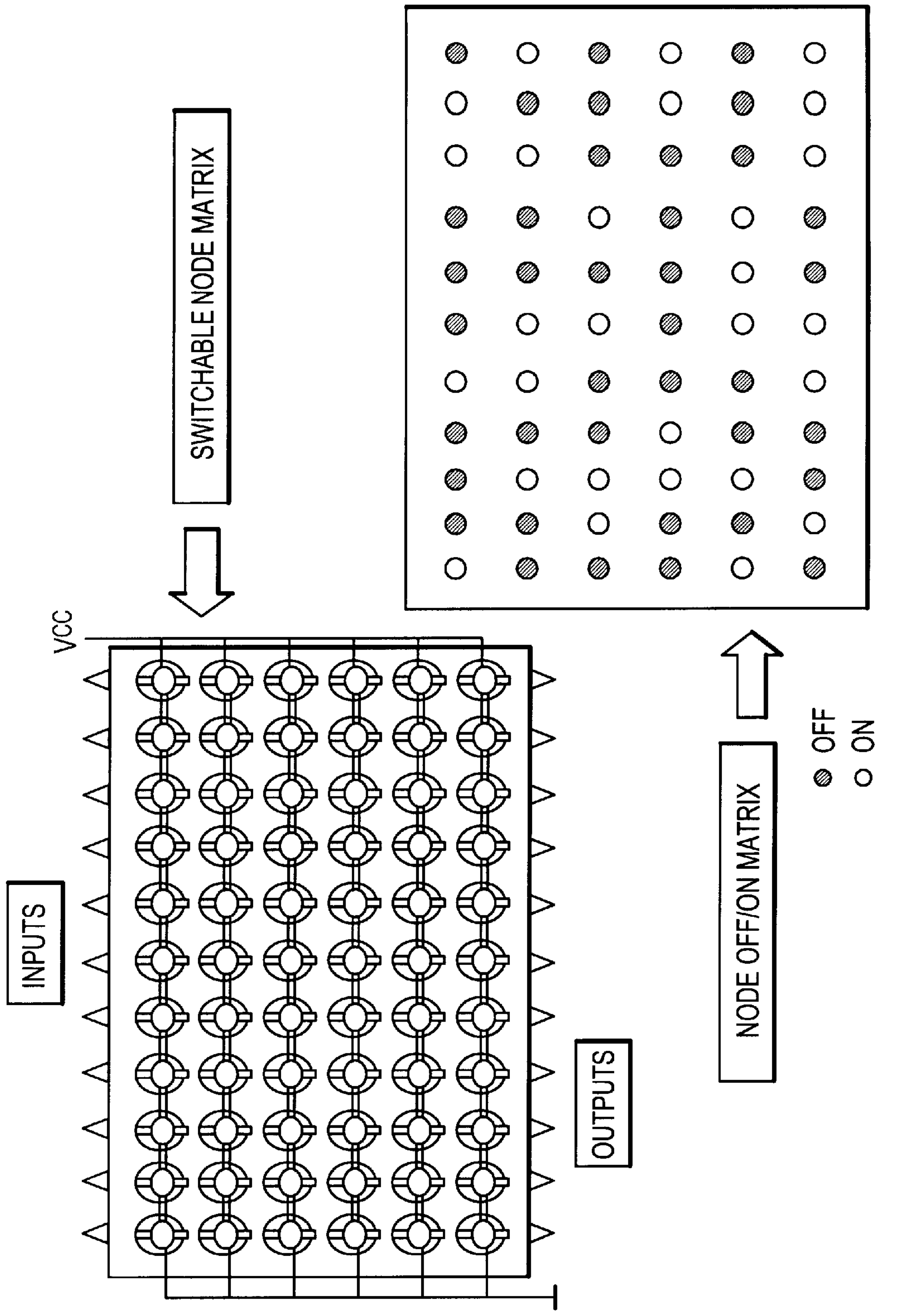
FIG. 30 schematically illustrates an exemplary programmable array using switch activatable nodes according to the invention.
Figure 31:
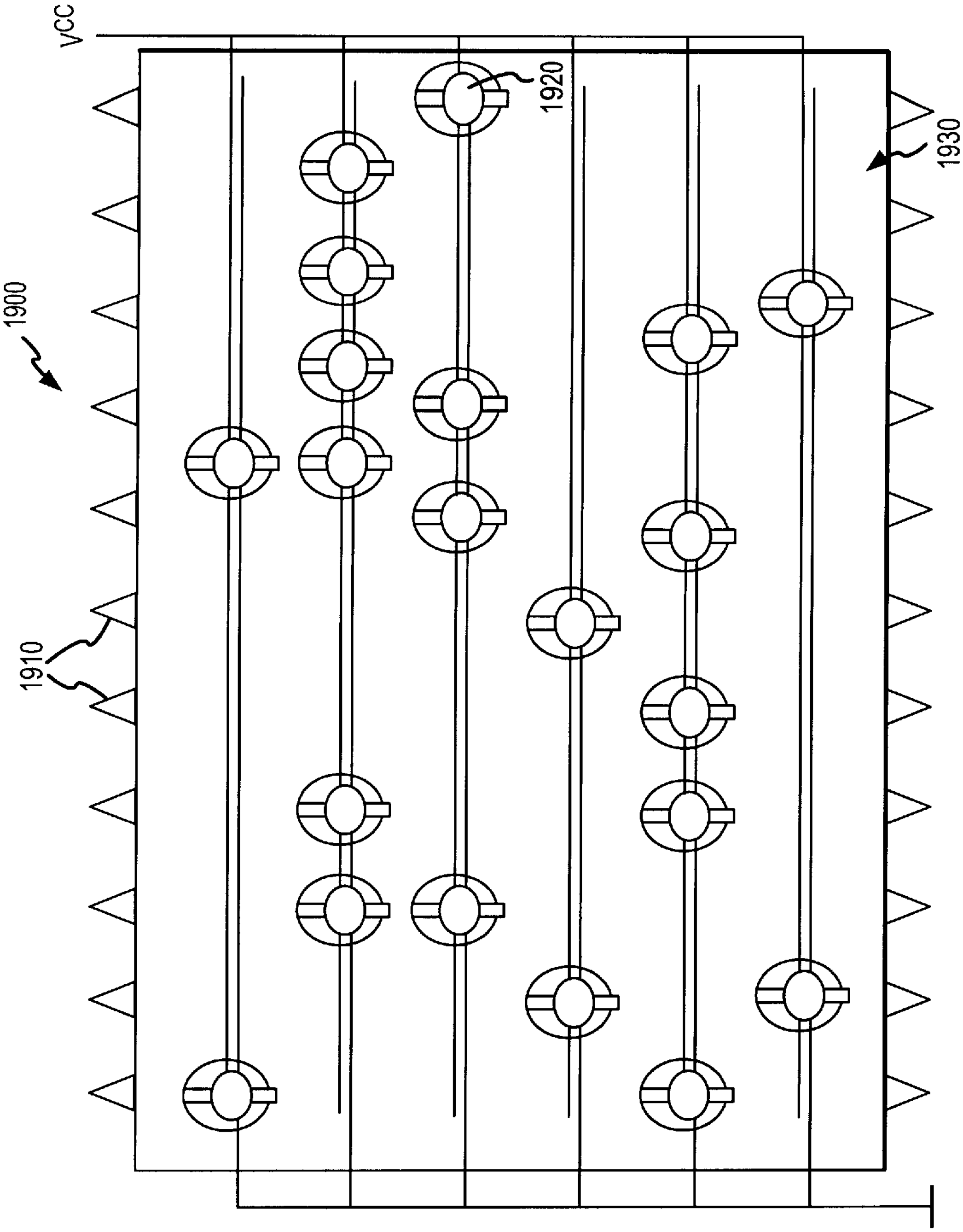
FIG. 31 schematically illustrates an exemplary matrix that is programmed by position according to the invention.

In another embodiment illustrated in FIG. 31, the invention provides an exemplary matrix 1900 which is programmed by position. The transfer function of the matrix is determined not only by the way in which input signals may be connected to a set of array inputs 1910, but also by the actual arrangement of processing nodes 1920 interacting with a resistance matrix 1930. Such an array may be implemented at the time of manufacture. One way in which a desired arrangement of nodes may be produced is by "burning" out the nodes of the high-density matrix of FIG. 29 which are targeted for removal using a laser. Alternatively, coupling the high-density node array of FIG. 29 with a switch matrix may enable the desired arrangement of active nodes by setting the corresponding node switches to "on" as shown in FIG. 30. One convenient way in which individual nodes can be set on or off could involve using a switching array to electrically isolate nodes from the power bus. Alternatively, nodes could be bypassed by electrically isolating their inputs and or outputs from the rest of the network. Another method might involve using a switch array to inhibit specific nodes by any of the methods known to those skilled in the art.

Figure 32A:
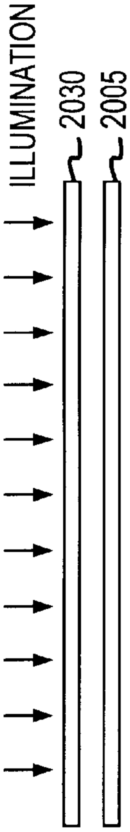
FIG. 32*a* is a side view of the array of FIG. 32.
Figure 32:
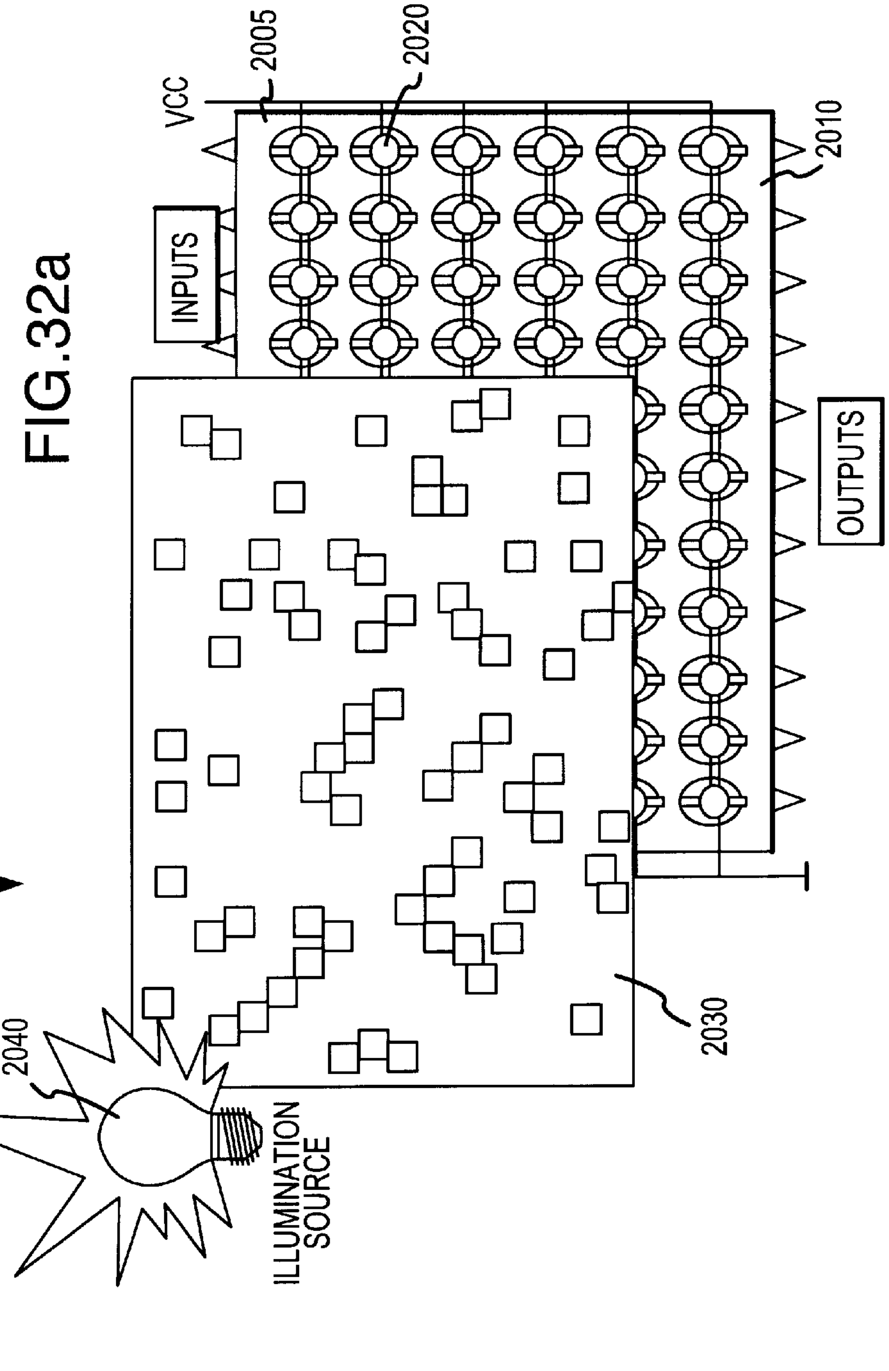
FIG. 32 schematically illustrates an array that is programmable using a light source according to the invention.

One particular embodiment of the invention is a light programmable array which uses a light source to program the array. One exemplary embodiment of such an array 2000 is illustrated in FIGS. 32 and 32*a.* In FIGS. 32 and 32*a,* a node matrix 2005 comprises a light sensitive resistance matrix 2010 of an array of high-density processing nodes 2020 is constructed of cadmium sulfide, cadmium selenite, or the like which has resistance that is inversely proportional to light intensity. With this arrangement, the magnitude of the effective connections between nodes 2020 is light controlled. Illumination of the light sensitive matrix 2010 is controlled by the state of a liquid crystal display layer 2030 inserted between the node matrix and an appropriate source of illumination 2040.

In a similar way, other light sensitive materials may be used or other arrangements to vary the illumination received by different regions of the light-dependent resistance matrix. It should also be appreciated that other methods of control of the resistance between points within a computing array of nodes are possible. For example, if a temperature dependent resistance matrix was used then the differential exposure of the matrix to a source of heat would alter the resistive interconnection of the array of nodes.

In this manner arrays could be constructed that directly image radiation. In general, the choice of an appropriate match between resistance matrix and resistance determining physical parameter would allow an imaging process. Some additional uses may be pH profiles in cell cultures to indicate variations in metabolic activity therein, contact profiles in a tactile pad when the resistance is pressure sensitive, and the like.

In the forgoing, computing arrays of nodes have been described as two-dimensional arrangements with a directionality to the signal pathway in terms of an information flow from input to output. In particular, arrays of nodes provide for a high level of numerical implementation using current techniques of integrated circuit manufacture. An approximate estimate would suggest that in comparison to the density of transistors implemented to produce today's microprocessors, networks of greater than a million nodes should be possible. Since the networks described according to this invention have similarity with the neuron organization of the animal brains it would be useful to be able to produce networks which numerically equate to, for example, the human brain. This would necessitate by current estimates a network of about 1000 million nodes.

Figure 33:
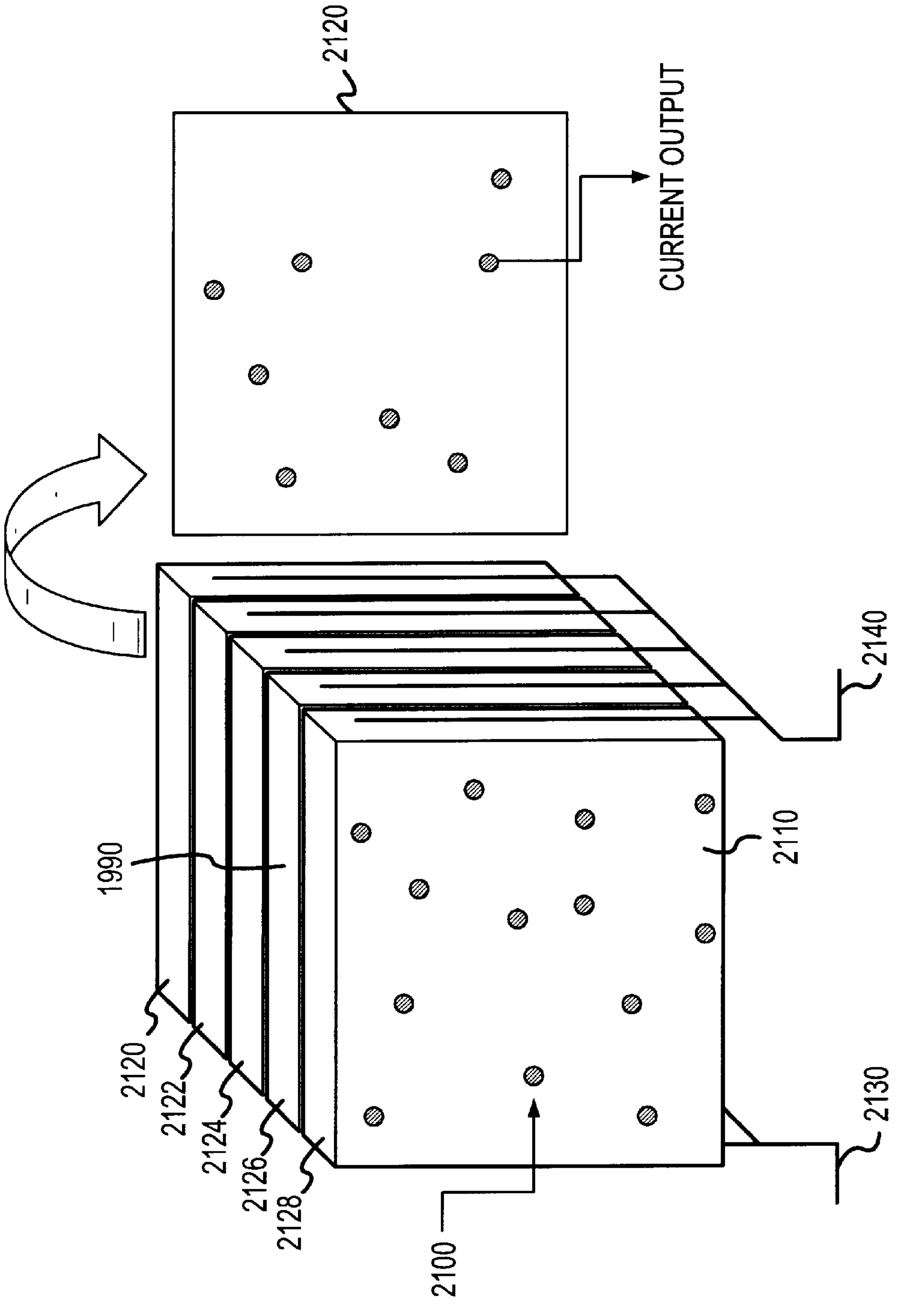
FIG. 33 schematically illustrates a multi-layered computing array according to the invention.

FIG. 33 schematically describes one possible way 1990 in which this could be achieved. In this implementation, the resistive matrix concept is extended to three dimensions such that, for example, current inputs 2100 are made electrically to the front or first layer 2110 of the network. Shown here is a three dimensional network comprising five layers 2120, 2122, 2124, 2126 and 2128 of resistive matrix with imbedded nodes (hidden from view) such that power to the nodes in each individual layer is provided by electrically isolated power buses 2130 and 2140. Output from the network is obtained by making electrical connection with points on the surface of the last layer 2120 as shown.

It will be appreciated that appropriate input nodes will be requires to convert actual signals into a current source as described earlier, and that similarly output from the network would be processed through an appropriate output type note as also described earlier herein.

FIGS. **34*a* and 34*b*** illustrate exemplary self-learning methods applied to the interconnection between complementary current mirrors. In these schemes, the degree of activity in each node operates to enhance the node's ability to process signals. In this way, the state of the network of nodes adjusts itself in accord with the form of the input signal pattern. In this manner, a self-learning mode of operation is provided.

More specifically, as schematically shown in FIG. **34*a* an input 2200 is transferred via a connector 2210 to a current mirror 2220 by a current mirror 2222 acting as a current sink. Two copies of this input current 2224 and 2226 are sourced by mirror 2220 such that mirrored current 2224 charges up a capacitor C thereby producing an increasing voltage on capacitor C proportional to the time averaged value of the input current 2200. This voltage at capacitor C is used to turn on a transistor 2228, which constitutes a voltage dependent resistance in an output 2230 of current mirror 2220. By the same argument made throughout the text describing the invention, varying the resistance ratio within a network of the type used herein, alters the influence of the specific output in terms of its transfer throughout the network. In this case, as the voltage on capacitor C increases, the current 2226 transferred to the points within the network to which output 2230 is connected increases (given that the resistance is large with respect to the value of the network voltage divided by the current 2226**). The net effect of this is that as current activity within this node increases the net output from the node also increases or in other terms the node becomes more "active" and simulates positive learning. Similar arrangements may be implemented to provide nodes in which the activity decreases as a function of the net activity in the node, and is obvious to those skilled in the art.

FIG. **34*b* is similar to that of 34*a* in that it shows schematically a self learning node 2240 for which the addition of a current mirror 2250 produces an output sink 2260** with the same dependence on the voltage on capacitor C and therefore the activity of the node.

Figure 35:
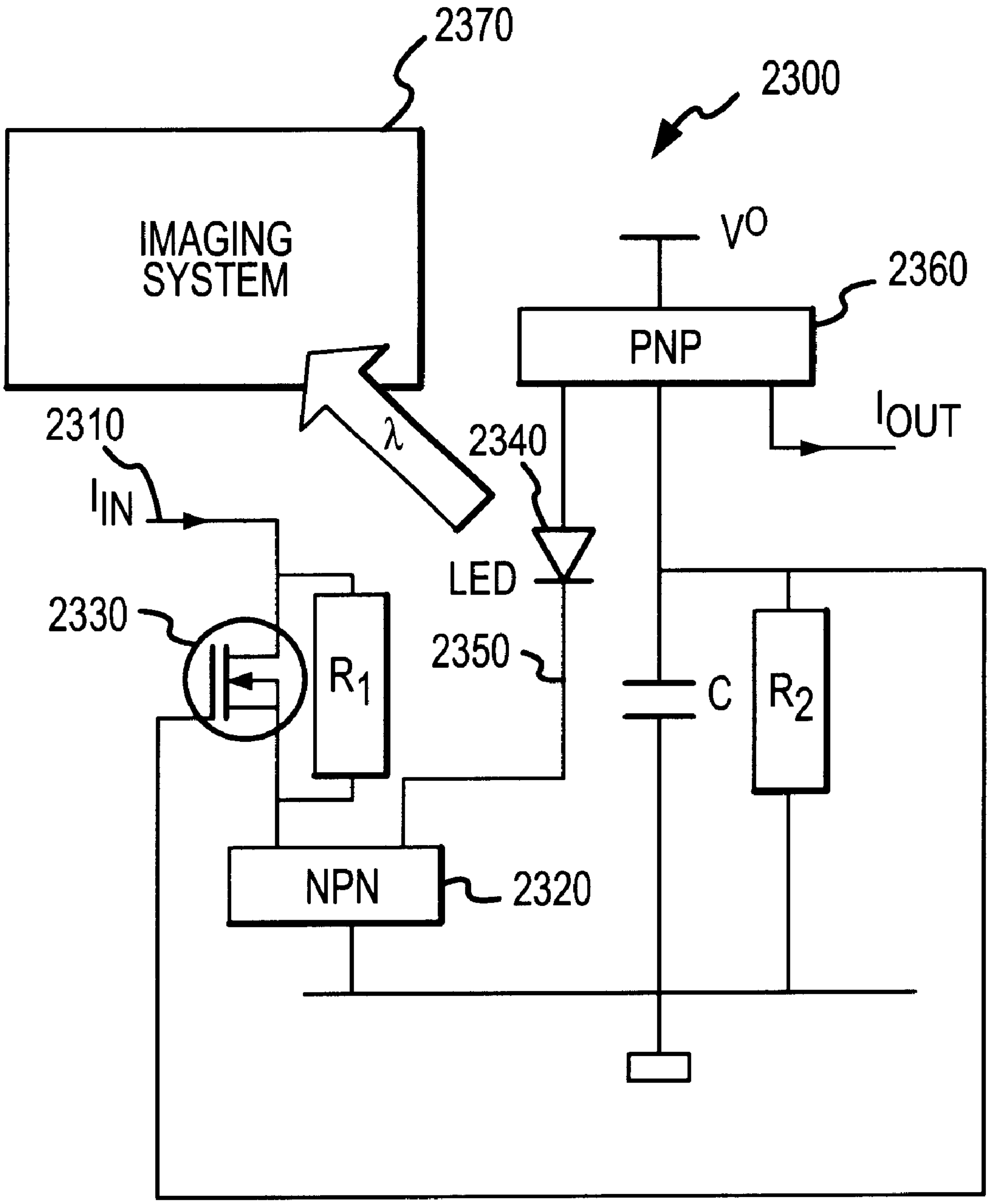
FIG. 35 schematically illustrates a method to optically read out the current activity of a current mirror network according to the invention.

FIG. 35 schematically illustrates a method to optically read out the current activity of a current mirror network according to the invention. In FIG. 35, a scheme is illustrated where node activity may be monitored in real time. The node activity is reflected by the photon output from a light emitting diode. Integrating light output over time indicates both average node activity as well as shown the "learning" trend for that node.

Figure 34A:
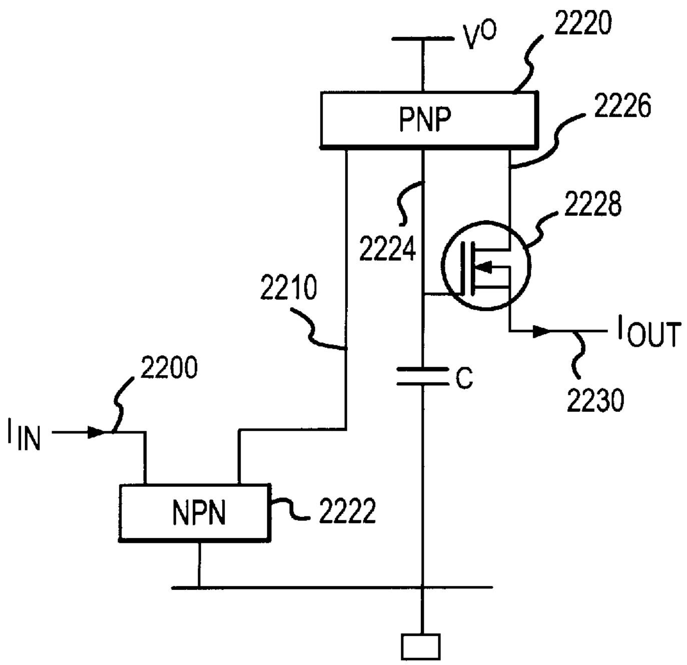
FIGS. 34*a* and 34*b* illustrate exemplary self-learning methods applied to the interconnection between complementary current mirrors according to the invention.
Figure 34B:
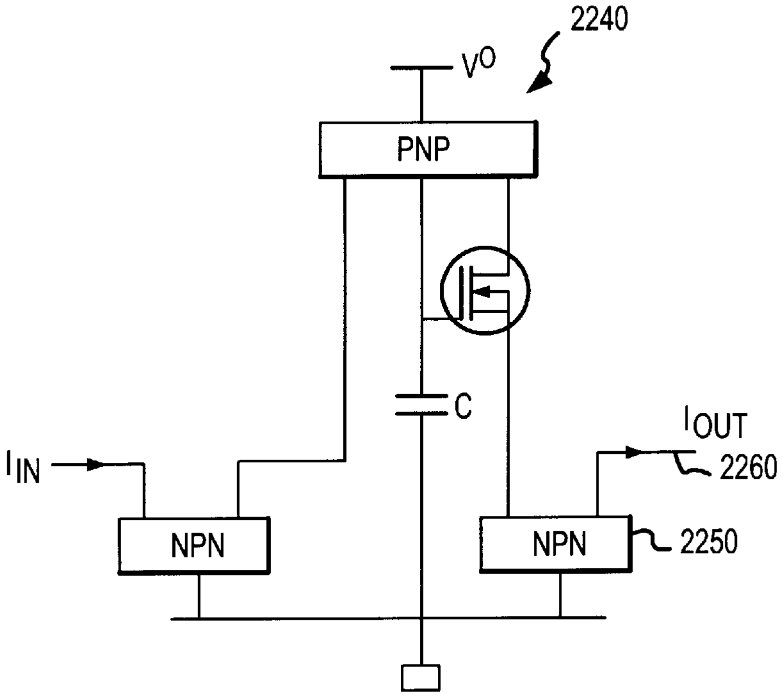

In FIG. 35, a learning node 2300 is shown schematically which is similar to those described in FIG. 34. The node activity parameter is reflected by the instantaneous voltage on a capacitor C, which in turn controls the transfer of an input current 2310 to a current mirror 2320 using a transistor 2330 as the controlling element. A resister R1 provides an initial level current to activate the node when the voltage on capacitor C is zero or too low to turn on transistor 2330 to any degree. A resister R2 is provided so that in the absence of node activity, for example, no input current 2310, the voltage on capacitor C decays back towards zero in affect mimicking a forget function. While this illustrates another implementation of a self-learning node with the additional feature that learning can be undone by node inactivity (forgetting the learned behavior), an additional feature has been incorporated in that an LED 2340 has been inserted into a connection 2350 between current mirror 2320 and a current mirror 2360. The effect of this modification is that for each node in a network having an incorporated LED, a visual pattern of its activity is displayed. If an imaging system 2370, such as is schematically shown, is used to monitor the LED output over time, this image record could be analyzed to quantitate the activity at any time during which the monitoring took place, as well as to analyze learning or forgetting trends as evidenced by increasing or decreasing LED output, respectively. It will also be appreciated that incorporation of a LED or other current indication device into the various nodes described herein could display a useful indication of the network activity. One specifically useful implementation applicable primarily to the node networks implemented in conjunction with a resistance matrix, would be to make the resistive matrix itself display the network activity. Such a resistive coating is available and commonly used as a part of the battery testing kits supplied either separately or on the side of batteries used to power various portable devices, usually to turn yellow in response to the battery state.

Figure 36:
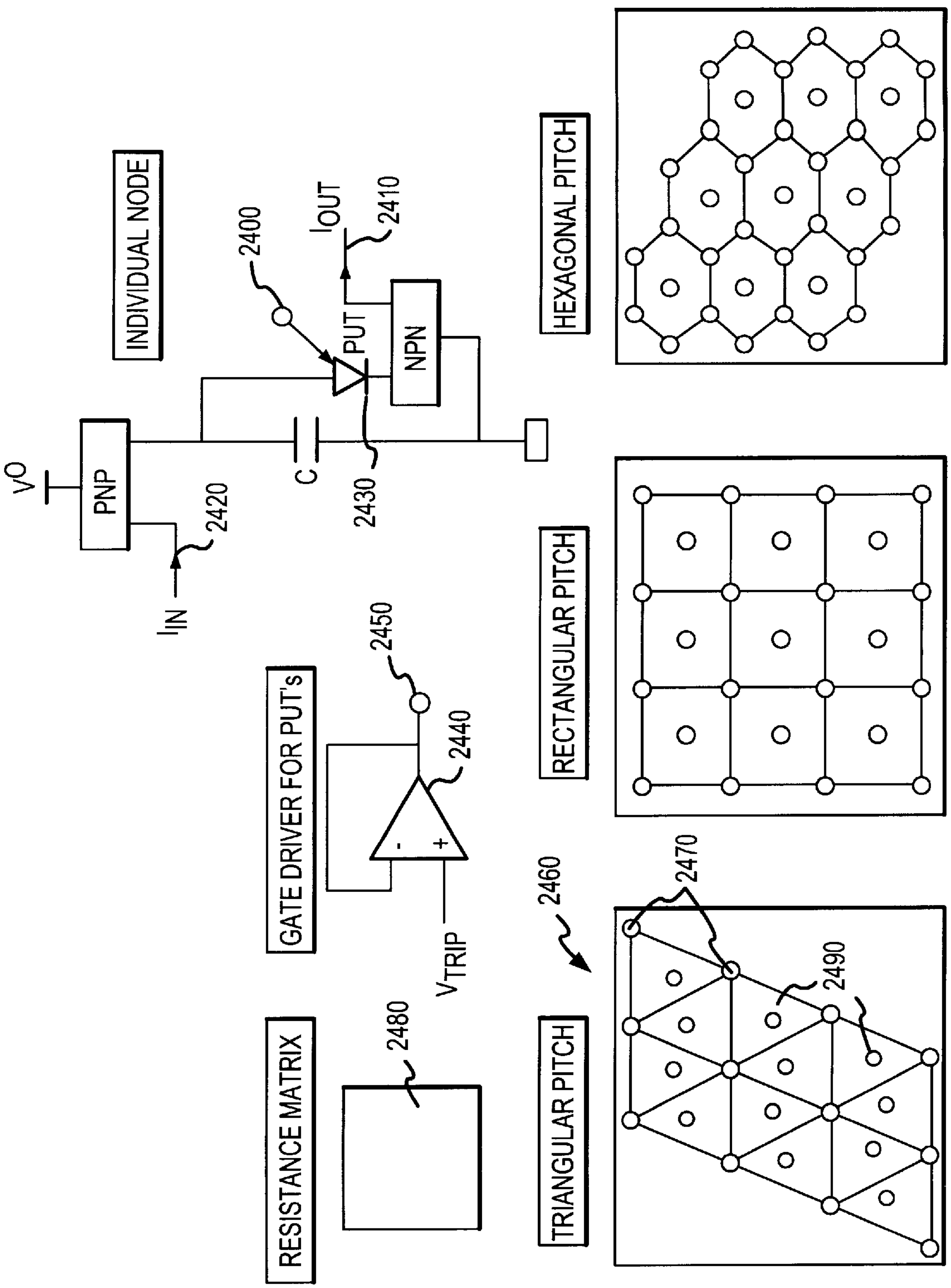
FIG. 36 schematically illustrates the principle by which the firing rate of individual pulse-mode nodes in a network is a function of the local activity around the individual node according to the invention.

FIG. 36 shows schematically a node network imbedded in a resistance matrix in a manner similar to that previously described. In FIG. 36, it is now desired to have the individual node activity as a function of the local activity occurring in the nearby network. This may occur, for example, where the size of the current packets passed by a pulse-mode type of node is a function of the local network activity. This may be accomplished, for example, by a pulse type node in which the charge-packet transfer element is a PUT type transistor 2400 controlling an output 2410 from the node in response to an input 2420. The voltage which accumulates on capacitor C at which the PUT fires is controlled by the voltage at a gate 2430 of the device, and could be provided, for example, by the circuit comprising an operational amplifier 2440 to give a buffered output 2450 equivalent to the set $V_{trip}$.

In an arrangement 2460, nodes 2470 are arranged on a triangular pitch within the resistance matrix, connecting the output 2450 from buffer 2440 to a resistive matrix 2480 at locations indicated at 2490. This provides a local node voltage which the PUT transistor senses to determine its firing point which is dependent on the current flow in the resistance matrix in the environment about that node The invention has now been described in detail for purposes of clarity and understanding. However, it will be appreciated that certain changes and modifications may be made within the scope of the appended claims. For example, it is well known by those skilled in the art that transistor arrangements exist which implement complex functions such as multiplication, division, squaring, taking the square root, log functions anti-log functions and the like. By incorporating one or more of these current mirror devices as described herein can be formed to combine the desired function with a current mirror so as to make it usable within the various implementations described for the invention.

What is claimed is:

1. An electronic network comprising:

a plurality of nodes, wherein each node comprises a current input and a current output, and wherein each node further comprises at least one transistor arranged as a first current mirror and a second current mirror, with the first and the second current mirrors being complementary to each other such that an output of the first current mirror is operably connected to an input of the second current mirror; and resistive connections connecting the nodes such that the output of one or more of the nodes is resistively connected to the input of one or more of the nodes.

2. A network as in claim 1, wherein at least some of the nodes are located at different distances relative to each other to provide different resistances between the nodes.

3. A network as in claim 1, wherein the resistance between the current inputs and the current outputs of the nodes is in the range from about 0.001 ohm to about 1,000 mega ohms.

4. A network as in claim 1, wherein the value of at least some of the resistive connections are different.

5. A network as in claim 1, further comprising a voltage supply to place certain nodes at a certain voltage.

6. A network as in claim 1, further comprising circuitry configured to provide an input current to at least one of the nodes.

7. A network as in claim 1, further comprising circuitry configured to convert a current output from at least one of the nodes to a different form of signal.

8. An electronic network comprising:

a plurality of nodes, wherein each node comprises a current input and a current output, and wherein each node further comprises at least one transistor arranged as a first current mirror and a second current mirror, with the first and the second current mirrors being complementary to each other such that an output of the first current mirror is connected to an input of the second current mirror;

resistive connections connecting the nodes such that the output of one or more of the nodes is resistively connected to the input of one or more of the nodes; and circuitry between the first current mirror and the second current mirror to store current from the first current mirror and to transfer at least some of the stored current to the second current mirror once a predetermined quantity of current has been transferred through the first current mirror.

9. An electronic network comprising:

a plurality of nodes, wherein each node comprises a current input and a current output, and wherein each node further comprises at least one transistor arranged as a first current mirror and a second current mirror, with the first and the second current mirrors being complementary to each other such that an output of the first current mirror is connected to an input of the second current mirror;

resistive connections connecting the nodes such that the output of one or more of the nodes is resistively connected to the input of one or more of the nodes; and a plurality of controllable switches to alter connections of the current outputs of at least some of the nodes with the current inputs of at least some of the nodes depending on the state of the switches.

10. An electronic network comprising:

a plurality of nodes, wherein each node comprises a current input and a current output, and wherein each node further comprises at least one transistor arranged as a first current mirror and a second current mirror, with the first and the second current mirrors being complementary to each other such that an output of the first current mirror is connected to an input of the second current mirror;

resistive connections connecting the nodes such that the output of one or more of the nodes is resistively connected to the input of one or more of the nodes;

circuitry between the first current mirror and the second current mirror to store current from the first current mirror and to transfer at least some of the stored current to the second current mirror once a predetermined quantity of current has been transferred from the first current mirror; and a plurality of controllable switches to alter connections of the current outputs of at least some of the nodes with the current inputs of at least some of the nodes depending on the state of the switches.

11. A method for processing current signals, the method comprising:

inputting one or more current signals into a current network, the network comprising a plurality of nodes, wherein each node comprises a current input and a current output, and wherein each node further comprises at least one transistor arranged as a first current mirror and a second current mirror, with the first and the second current mirrors being complementary to each other such that an output of the first current mirror is connected to an input of the second current mirror, and resistive connections connecting the nodes such that the output of one or more of the nodes is resistively connected to the input of one or more of the nodes;

permitting the current signal to pass through at least some of the nodes;

outputting one or more current signals from the network after passing through at least some of the nodes; and evaluating the output current signal.

12. A method as in claim 11, further comprising varying at least some of the resistive connections to provide an arrangement of non-symmetric resistive connections in the network.

13. A method as in claim 12, wherein the varying step comprises spacing at least some of the nodes at different distances relative to each other.

14. A method as in claim 12, wherein the varying step comprises altering the connections of the current outputs of at least some of the nodes with the current inputs of at least some of the nodes with a controllable switch matrix.

15. A method as in claim 11, further comprising supplying a certain voltage to each of the nodes.

16. A method as in claim 11, further comprising producing pulsed current signals at each of the nodes.

17. A method for processing electronic signals, comprising:

providing a circuit having a plurality of nodes, at least some of which comprise at least one transistor arranged as a first current mirror and a second current mirror, with the first and the second current mirrors being complementary to each other such that an output of the first current mirror is connected to an input of the second current mirror, and wherein the nodes are connected by resistive connections;

inputting at least one current signal at a first current value to one of the nodes;

outputting at least one current signal from the node at a second current value which is related to the first current value; and inputting at least a portion of the second current signal into one of the inputs of another node in the circuit.

18. A method for processing electronic signals, comprising:

inputting one or more electrical current signals into a network of nodes, each of which comprises at least one transistor arranged as a first current mirror and a second current mirror, with the first and the second current mirrors being complementary to each other such that an output of the first current mirror is connected to an input of the second current mirror, with the nodes being resistively connected to each other, to produce one or more output current signals; and feeding at least one of the output current signals back into the network of nodes.

19. A method as in claim 18, further comprising providing a second network of current nodes, and feeding at least one of the output current signals into the second network.

20. An electronic network comprising:

a plurality of nodes, wherein each node comprises a current input and a current output, and wherein each node further comprises at least one transistor arranged as a first current mirror and a second current mirror, with the first and the second current mirrors being complementary to each other such that an output of the first current mirror is connected to an input of the second current mirror;

a light sensitive resistive matrix into which the nodes are incorporated such that the resistances between the nodes is controllable based on light patterns introduced onto the matrix.

21. A network as in claim 20, wherein the resistive matrix is constructed from a group of materials consisting of cadmium sulfide and cadmium selenite.

22. A method as in claim 11, further comprising monitoring the activity of each of the nodes.

* * * * *